United States Patent
Wu

(10) Patent No.: US 12,163,814 B2
(45) Date of Patent: Dec. 10, 2024

(54) DISPLACEMENT MEASURING APPARATUS, DISPLACEMENT MEASURING METHOD AND PHOTOLITHOGRAPHY DEVICE

(71) Applicant: SHANGHAI MICRO ELECTRONICS EQUIPMENT (GROUP) CO., LTD., Shanghai (CN)

(72) Inventor: Ping Wu, Shanghai (CN)

(73) Assignee: SHANGHAI MICRO ELECTRONICS EQUIPMENT (GROUP) CO., LTD, Shanghai (CN)

( * ) Notice: Subject to any disclaimer, the term of this patent is extended or adjusted under 35 U.S.C. 154(b) by 505 days.

(21) Appl. No.: 17/606,321

(22) PCT Filed: Apr. 24, 2020

(86) PCT No.: PCT/CN2020/086684
§ 371 (c)(1),
(2) Date: Oct. 25, 2021

(87) PCT Pub. No.: WO2020/216325
PCT Pub. Date: Oct. 29, 2020

(65) Prior Publication Data
US 2022/0214193 A1 Jul. 7, 2022

(30) Foreign Application Priority Data
Apr. 26, 2019 (CN) .......................... 201910344621.4

(51) Int. Cl.
*G01D 5/353* (2006.01)
*G01D 5/38* (2006.01)
*G03F 7/00* (2006.01)

(52) U.S. Cl.
CPC .......... *G01D 5/35306* (2013.01); *G01D 5/38* (2013.01); *G03F 7/70775* (2013.01)

(58) Field of Classification Search
None
See application file for complete search history.

(56) References Cited

U.S. PATENT DOCUMENTS

2005/0062981 A1* 3/2005 Kao .................. G01B 9/02027
356/499
2015/0043005 A1* 2/2015 de Groot ............ G03F 7/70775
356/487
2018/0181006 A1 6/2018 Goodwin
(Continued)

FOREIGN PATENT DOCUMENTS

CN 1793778 A 6/2006
CN 104567696 A 4/2015
(Continued)

OTHER PUBLICATIONS

CN 106931887A ; Inventors Wu Ping; Zhang Zhiping (Year: 2015).*

*Primary Examiner* — Nancy Bitar
(74) *Attorney, Agent, or Firm* — MUNCY, GEISSLER, OLDS & LOWE, P.C.

(57) ABSTRACT

A displacement measuring apparatus, a displacement measuring method and a photolithography device are disclosed. The displacement measuring apparatus includes a light source module (300), a diffractive member (200), a reader head assembly (100), an optical detection module (410, 411, 412, 413) and a signal analysis module (500). The reader head assembly (100) is configured to receive two input light beams (610, 611) from the light source module (300) and guide them so that they come into contact in parallel with the diffractive member (200) and are both diffracted. The diffracted input light beams are guided and combined to form at least one output light beam (612, 613, 614) each containing diffracted light signals respectively of the two input light beams (610, 611), which exit in the same direction from the same light spot location of the diffractive member (200).

(Continued)

Displacement information of the diffractive member (200) can be derived from phase change information contained in an interference signal produced by each output light beam (612, 613, 614). The displacement measuring apparatus and method can be used to achieve independent displacement measurements in different direction, with adaptivity to a wide angle and reduced nonlinearity errors. The photolithography device includes the displacement measuring apparatus.

25 Claims, 6 Drawing Sheets

(56) References Cited

U.S. PATENT DOCUMENTS

| | | | |
|---|---|---|---|
| 2018/0202842 A1 | | 7/2018 | Liu |
| 2020/0306879 A1 | * | 10/2020 | El-Khoury ......... B23K 26/0608 |

FOREIGN PATENT DOCUMENTS

| | | | | | |
|---|---|---|---|---|---|
| CN | 104949616 A | | 9/2015 | | |
| CN | 106931887 | * | 12/2015 | | |
| CN | 106813578 A | | 6/2017 | | |
| CN | 106931887 A | * | 7/2017 | ............. | G01B 11/02 |
| CN | 107003155 A | | 8/2017 | | |
| CN | 107664482 A | | 2/2018 | | |
| CN | 107860318 A | | 3/2018 | | |
| CN | 109579694 A | | 4/2019 | | |
| JP | S63038102 | | 2/1988 | | |
| JP | H08005324 | | 1/1996 | | |
| TW | 200912385 A | | 3/2009 | | |

\* cited by examiner

DISPLACEMENT MEASURING APPARATUS, DISPLACEMENT MEASURING METHOD AND PHOTOLITHOGRAPHY DEVICE

TECHNICAL FIELD

The present invention relates to the technical field of displacement measurement and, more specifically, to a displacement measuring apparatus, a displacement measuring method and a photolithography device.

BACKGROUND

During the manufacturing, processing and use of precision machinery, it is necessary to coordinate measuring or sensing devices that are sensitive to displacement. For example, existing integrated circuits (IC), precision machinery and micro-electromechanical systems are all equipped with high-resolution, high-precision displacement measuring apparatuses (or displacement sensors). For example, with integrated circuits developing toward larger scales and higher integration, the demand for photolithography tools with higher overlay accuracy is increasing, imposing increasingly stricter requirements on accuracy of the measured position information of wafer and reticle stages.

In recent years, rapid advancements have been witnessed in nano-scale measurement including nanoscale displacement measurement. Nano-scale measurement techniques can be categorized into optical and non-optical. Optical nano-scale measurement utilizes interference fringes of laser or X-ray beams with very short wavelengths and provides a measurement resolution of several nanometers. However, measurement accuracy of conventional interferometers is largely affected by factors of the surrounding environment (e.g., errors may arise from variations in factors including temperature and pressure), leading to insufficient measurement reproducibility that cannot meet the requirements of photolithography tools with higher overlay accuracy.

Gratings (or grating displacement sensors) are measurement and feedback devices can be used to measure linear or angular displacement. An optical path length that can be measured by a grating is irrespective of its measurement range and may be very small (generally, a few millimeters). Therefore, such displacement sensors feature measurement accuracy that is insensitive to environmental factors, high measurement stability, structural simplicity and ease of miniaturization, which make them an important part of nano-scale measurement. In the most recent generation of photolithography systems, they have been increasingly used in place of interferometers to perform high-precision picometer-scale measurement tasks that require even higher stability.

However, existing grating-based displacement measuring systems are associated with a number of problems such as, for example, interdependence between horizontal displacement measurement and vertical displacement measurement (i.e., they are intercoupled and require an algorithm to decouple them from each other), small angular tolerances and significant nonlinearity errors that may arise from the co-sharing of one or more optical paths by too many reader head components.

SUMMARY OF THE INVENTION

The present invention provides a displacement measuring apparatus which is capable of measuring displacement with adaptivity to a wide angle, and independently performing displacement measurement in different directions, incurring less nonlinearity errors. The present invention also provides a displacement measuring method and a photolithography device including the displacement measuring apparatus.

According to one aspect of the present invention, there is provided a displacement measuring apparatus, comprising:

a light source module, configured to produce a first input light beam and a second input light beam;

a diffractive member, comprising a light contacting surface and a plurality of duplicate diffractive elements arranged in a direction parallel to the light contacting surface;

a reader head assembly, comprising at least two retroreflective elements, the reader head assembly configured to receive and guide the first and second input light beams to come into contact with the light contacting surface of the diffractive member in parallel and to be diffracted thereon, at least one of the diffracted first and second input light beams is then guided by the at least two retroreflective elements so as to be combined with rest of the diffracted first and second input light beams to form at least one output light beam each containing diffracted light signals respectively of the first and second input light beams, which exit in a same direction from a same light spot location of the light contacting surface of the diffractive member;

an optical detection module, configured to detect each of the at least one output light beam; and a signal analysis module, connected to the optical detection module, the signal analysis module configured to derive displacement information of the diffractive member from phase change information contained in an interference signal produced by each of the at least one output light beam.

Optionally, as a result of being guided by the reader head assembly to come into contact with the light contacting surface of the diffractive member in parallel, the first input light beam experiences a first diffraction at a first light spot location to result in a respective first diffracted light beam, and the second input light beam experiences a first diffraction at a second light spot location to result in a respective first diffracted light beam, the first diffracted light beam of the first input light beam is then reflected successively by the retroreflective elements and the diffractive member so as to at least partially coincides with the first diffracted light beam of the second input light beam at the second light spot location and exits together with the first diffracted light beam of the second input light beam in the same direction, resulting in the formation of a first output light beam that forms an interference signal containing phase change information reflecting first displacement information of the diffractive member in a vertical degree of freedom along a direction of a normal to the light contacting surface.

Optionally, as a result of being guided by the reader head assembly to come into contact with the light contacting surface of the diffractive member in parallel, the first input light beam experiences a first diffraction at the first light spot location to result in a respective first diffracted light beam, and the second input light beam experiences a first diffraction at the second light spot location to result in a respective first diffracted light beam, the first diffracted light beam of the second input light beam is then reflected successively by the retroreflective elements and the diffractive member so as to at least partially coincides with the first diffracted light beam of the first input light beam at the first light spot location and exits together with the first diffracted light beam of the first input light beam in the same direction, resulting in the formation of a second output light beam that forms an interference signal containing phase change information reflecting second displacement information of the diffractive member in the vertical degree of freedom along the direction of the normal to the light contacting surface.

Optionally, each of the first and second output light beams contains first diffracted light signals respective of the first and second input light beams, which are of diffraction orders of same sign and magnitude, and wherein the interference signals of the first and second output light beams are inverted in phase.

Optionally, the first output light beam contains $+1^{st}$ order first diffracted light signals of the first and second input light beams, and the second output light beam contains $-1^{st}$ order first diffracted light signals of the first and second input light beams.

Optionally, the signal analysis module is further configured to derive displacement information of the diffractive member in a rotational degree of freedom that rotates about an axis within the light contacting surface from the phase change information of the interference signals of the first and second output light beams.

Optionally, first diffracted light beams of the first and second input light beams resulting from first diffractions thereof occurring as a result of contact with the light contacting surface of the diffractive member in parallel under the guidance of the reader head assembly are retroreflected by the retroreflective elements back onto the diffractive member and both diffracted thereon for a second time, resulting in second diffracted light beams, which at least partially coincide with each other at a third light spot location of the diffractive member and exit therefrom in a same direction and thereby form a third output light beam that form an interference signal containing phase change information reflecting third displacement information of the diffractive member in a horizontal degree of freedom along a direction parallel to the light contacting surface.

Optionally, the diffractive member is a one-dimensional grating or a two-dimensional grating.

Optionally, each of the retroreflective elements is one selected from a group comprising a corner cube prism, a Porro prism, a cat's eye reflector and a Dove prism.

Optionally, the reader head assembly comprises a beam angle controller.

Optionally, the beam angle controller is one selected from a group comprising a single wedge, a wedge pair, a diffraction grating and a birefringent element.

Optionally, the first and second input light beams are laser beams of different frequencies.

Optionally, the light source module comprises a dual-frequency laser based on optical fiber transmission, and wherein the reader head assembly is further configured to, prior to the contact of the first and second input light beams with the diffractive member in parallel, receive the first and second input light beams, split portions from the respective input light beams, and combine the split portions to form a remote reference light beam.

Optionally, the light source module comprises a free space dual-frequency laser and a beam splitting element, the free space dual-frequency laser configured to produce a dual-frequency light beam, the beam splitting element configured to split the dual-frequency light beam into two light beams with orthogonal polarization directions.

Optionally, the light source module or the reader head assembly comprises a polarization control element configured to cause the diffracted light signals respectively of the first and second input light beams in each of the at least one output light beam to enter the optical detection module with a same polarization direction.

Optionally, the first and second input light beams are laser beams of same frequency.

Optionally, the light source module or the reader head assembly comprises a polarization control element configured to cause the diffracted light signals respectively of the first and second input light beams in each of the at least one output light beam to enter the optical detection module with orthogonal polarization direction.

Optionally, the reader head assembly produces at least four output light beams, and wherein the optical detection module is configured to detect the at least four output light beams and, for each of the output light beams, shift phase of an interference signal thereof to successively output four signals each offset from a previous one of the four signals by 90 degrees.

According to another aspect of the present invention, there is provided a displacement measuring method, comprising:

providing a diffractive member comprising a light contacting surface and a plurality of duplicate diffractive elements arranged in a direction parallel to the light contacting surface;

producing a first input light beam and a second input light beam;

guiding the first and second input light beams to come into contact with the light contacting surface of the diffractive member in parallel and to be diffracted thereon, using the at least two retroreflective elements to guide at least one of the diffracted first and second input light beams to be combined with rest of the diffracted first and second input light beams to form at least one output light beam each containing diffracted light signals respectively of the first and second input light beams, which exit in a same direction from a same light spot location of the light contacting surface of the diffractive member;

detecting each of the at least one output light beam; and deriving displacement information of the diffractive member from phase change information contained in an interference signal produced by each of the at least one output light beam.

Optionally, as a result of being guided to come into contact with the light contacting surface of the diffractive member in parallel, the first input light beam experiences a first diffraction at a first light spot location to result in a respective first diffracted light beam, and the second input light beam experiences a first diffraction at a second light spot location to result in a respective first diffracted light beam, the first diffracted light beam of the first input light beam is then reflected successively by the retroreflective elements and the diffractive member so as to at least partially coincides with the first diffracted light beam of the second input light beam at the second light spot location and exits together with the first diffracted light beam of the second input light beam in the same direction, resulting in the formation of a first output light beam that forms an interference signal containing phase change information reflecting first displacement information of the diffractive member in a vertical degree of freedom along a direction of a normal to the light contacting surface.

Optionally, a phase change indicated in the interference signal of the first output light beam and an amount of displacement of the diffractive member in the vertical degree of freedom satisfy $$\varphi z1 = \frac{8\pi m}{\lambda} * \Delta Z1 * \cos\theta,$$

where φz1 represents the phase change indicated in the interference signal of the first output light beam; ΔZ1, the amount of displacement of the diffractive member in the vertical degree of freedom; λ, an average wavelength of the first and second input light beams; and θ, an $m^{th}$ order diffraction angle of the first diffractions that occur as a result of the first and second input light beams coming into contact with the light contacting surface of the diffractive member in parallel, where m is an integer other than 0.

Optionally, as a result of being guided to come into contact with the light contacting surface of the diffractive member in parallel, the first input light beam experiences a first diffraction at the first light spot location to result in a respective first diffracted light beam, and the second input light beam experiences a first diffraction at the second light spot location to result in a respective first diffracted light beam, the first diffracted light beam of the second input light beam is then reflected successively by the retroreflective elements and the diffractive member so as to at least partially coincides with the first diffracted light beam of the first input light beam at the first light spot location and exits together with the first diffracted light beam of the first input light beam in the same direction, resulting in the formation of a second output light beam that forms an interference signal containing phase change information reflecting second displacement information of the diffractive member in the vertical degree of freedom; wherein the interference signals of the first and second output light beams are inverted in phase.

Optionally, the displacement measuring method further comprises:

detecting the first and second output light beams and deriving displacement information of the diffractive member in a rotational degree of freedom that rotates about an axis within the light contacting surface from the displacement information in the vertical degree of freedom of the diffractive member reflected in the phase change information of the interference signals of the first and second output light beams.

Optionally, amounts of displacement of the diffractive member indicated respectively in the first and second output light beams satisfy $$Ry = \frac{\Delta Z2 - \Delta Z1}{D_{f1f2}},$$

where ΔZ1 and ΔZ2 are the amounts of displacement of the diffractive member indicated respectively in the first displacement information of the diffractive member in the vertical degree of freedom reflected in the first output light beam and in the second displacement information of the diffractive member in the vertical degree of freedom reflected in the second output light beam, and $D_{f1f2}$ is a distance between the first and second light spot locations.

Optionally, first diffracted light beams of the first and second input light beams resulting from first diffractions thereof occurring as a result of contact with the light contacting surface of the diffractive member in parallel are retroreflected by the retroreflective elements back onto the diffractive member and both diffracted thereon for a second time, resulting in second diffracted light beams, which at least partially coincide with each other at a third light spot location of the diffractive member and exit therefrom in a same direction and thereby form a third output light beam that form an interference signal containing phase change information reflecting third displacement information of the diffractive member in a horizontal degree of freedom along a direction parallel to the light contacting surface.

Optionally, a phase change indicated in the interference signal of the third output light beam and an amount of displacement of the diffractive member in the horizontal degree of freedom satisfy $$\varphi x1 = -\frac{2\pi m}{P} * \Delta X * 2 - \frac{2\pi m}{P} * \Delta X * 2 = -\frac{8\pi m}{P} * \Delta X,$$

where φx1 represents the phase change indicated in the interference signal of the third output light beam, ΔX is the amount of displacement of the diffractive member in a first direction, P is a pitch of the duplicate diffractive elements in the diffractive member in the direction of the horizontal degree of freedom, and m is an integer other than 0.

According to another aspect of the present invention, there is provided a photolithography device, comprising a wafer stage and a reticle stage, which are moveable relative to each other, wherein the photolithography device further comprises the displacement measuring apparatus as defined above, and wherein the diffractive member is attached to one of the wafer stage and the reticle stage, and the reader head assembly is attached to rest of the wafer stage and the reticle stage.

The displacement measuring apparatus of the present invention has at least the following advantages: first, displacement information of the diffractive member is derived from phase change information indicated in an interference signal of each output light beam, without needing the use of an algorithm for decoupling; second, the separate first and second input light beams are brought into contact with the diffractive member in parallel and are diffracted thereon, and the diffracted first and second input light beams are guided and combined to form at least one output light beam each containing diffracted light signal respectively of the first and second input light beams, which exit in the same direction from the same light spot location on the light contacting surface of the diffractive member, thus facilitating the elimination of angular divergence of the coherent light beams caused by any rotation of the diffractive member (e.g., relative to an axis within the light contacting surface) and achieving adaptivity to a wide angle, reduced influence of such rotation on the intensity of the interference signal, improved measurement accuracy, as well as enhanced angular tolerance and lowered assembly and orientation control complexity of the apparatus; and third, the two input light beams provided to the reader head assembly are separate from each other (spatially), do not interact with each other during measurement and are combined only before the final interference, significantly reducing or even eliminating non-linearity errors that may occur due to co-sharing of one or more optical paths, when compared to measuring system that employ a single input light beam and thus tend to suffer from frequency mixing.

Since the displacement measuring method of the present invention is based on the same overall concept as the above-described displacement measuring apparatus, it has similar or the same advantages.

Since the photolithography device of the present invention incorporates the above-described displacement measuring apparatus, it also has similar or the same advantages.

BRIEF DESCRIPTION OF THE DRAWINGS

FIG. 2 (b) schematically illustrates a Porro prism serving as a retroreflective element in the displacement measuring apparatus according to an embodiment of the present invention.

FIG. 2 (c) schematically illustrates a Dove prism serving as a retroreflective element in the displacement measuring apparatus according to an embodiment of the present invention.

FIG. 2 (d) schematically illustrates a cat's eye reflector serving as a retroreflective element in the displacement measuring apparatus according to an embodiment of the present invention.

LIST OF REFERENCE SIGNS

Figure 1:
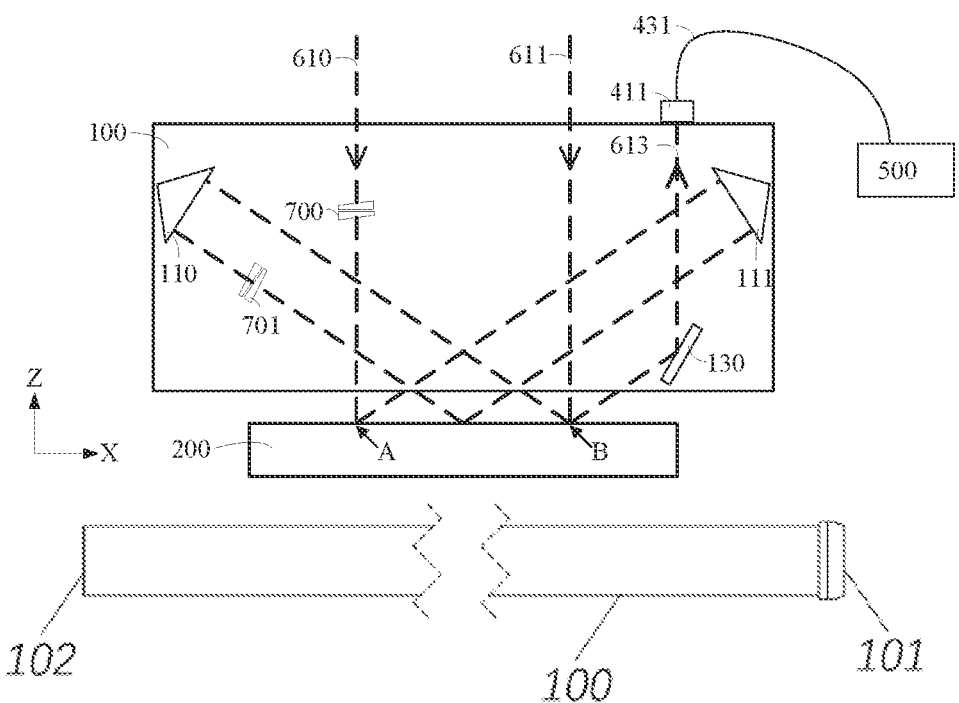
FIG. 1 schematically illustrates the formation of a first output light beam in a displacement measuring apparatus according to an embodiment of the present invention.

100, a reader head assembly;
110, a first retroreflective element; 111, a second retroreflective element;
130, a first reflecting element; 131, a second reflecting element; 132, a third reflecting element; 133, a first beam splitting element; 134, a second beam splitting element; 135, a third beam splitting element; 136, a fourth shutter;
200, a diffractive member;
300, a light source module;
310, a free space dual-frequency laser; 311, a single-frequency laser;
320, a polarization state modifier; 321, a second polarizing splitter; 322, an isolator; 323, a first acousto-optic frequency shifter; 324, a second acousto-optic frequency shifter; 325, a first shutter; 326, a second shutter; 327, a third shutter;
330, a first beam splitter; 331, a second beam splitter; 332, a third beam splitter; 333, a fourth beam splitter; 334, a first reflector; 335, a second reflector;
340, a first polarization-maintaining optical fiber coupler; 341, a second polarization-maintaining optical fiber coupler;
350, a multimode optical fiber coupler;
370, a third beam angle controller;
410, a third optical detection module; 411, a first optical detection module; 412, a second optical detection module; 413, a fourth optical detection module;
430, a third signal transmission optical fiber; 431, a first signal transmission optical fiber; 432, a second signal transmission optical fiber; 433, a fourth signal transmission optical fiber;
450, a first polarization-maintaining optical fiber collimator; 451, a second polarization-maintaining optical fiber collimator;
470, a first polarization-maintaining optical fiber; 471, a second polarization-maintaining optical fiber;
481, a quarter-wave plate; 482, a non-polarizing splitter; 483, a first polarizing splitter; 484, a second polarizing splitter; 485, a first optical coupler; 486, a second optical coupler; 487, a third optical coupler; 488, a fourth optical coupler;
500, a signal analysis module;
610, a first input light beam; 611, a second input light beam; 612, a third output light beam; 613, a first output light beam; 614, a second output light beam;
621, a light beam incident on a retroreflective element; 622, light beam exiting the retroreflective element;
700, a first beam angle controller; 701, a second beam angle controller; 702, a third beam angle controller;
1301, a lens; 1302, a concave mirror.

DETAILED DESCRIPTION

The present invention seeks to provide a displacement measurement solution to the problems associated with existing grating-based displacement measuring systems, as discussed in the Background section, such as, for example, measurement signals for different directions (degrees of freedom) that are not independent of, but inter-coupled with, each other and thus require an additional algorithm to decoupled them from each other, small angular tolerances and stringent requirements on system assembling accuracy due to the optical path design, and significant nonlinearity errors in measurement signals arising from the co-sharing of one or more optical path by components in a reader head of an optical encoder for transmitting different diffraction signals.

To this end, the present invention provides a displacement measuring apparatus, a displacement measuring method and a photolithography device including the displacement measuring apparatus. The displacement measuring apparatus includes at least a light source module, a diffractive member, a reader head assembly, optical detection modules and a signal analysis module.

Specifically, the light source module is configured to produce a first input light beam and a second input light beam. The diffractive member includes a light contacting surface and a plurality of duplicate diffractive elements that are arranged along a direction parallel to the light contacting surface. The reader head assembly includes at least a set of retroreflective elements and is configured to receive the first and second input light beams, guide them so that they come into contact with the diffractive member in parallel (not including the scenario of coincidence) and both diffracted, and guide and combine the diffracted first and second input light beams into at least one output light beam each containing diffracted light signals respectively of the first and second input light beams, which exit in the same direction from a single light spot location of the light contacting surface of the diffractive member (here, the "single light spot location" refers to an area where two same light spots are located, for example, a circular area centered at the center of one light spot and having a diameter 0.5-1.5 times a diameter of the light spot (i.e., two light spot locations may be nested or tangent to each other)). In this way, each output light beam produces an interference signal containing phase change information that reflects whether displacement of the diffractive member has occurred in a degree of freedom in a two- or three-dimensional space. Each of the optical detection modules is configured to detect a respective output light beam from the reader head assembly. The signal analysis module is coupled to the optical detection modules and is configured to derive displacement information of the diffractive member from phase change information contained in an interference signal produced by an output light beam. It is to be noted, in practical applications, all or some of the above components may be those of an optical encoder system. In this case, the diffractive member may be, for example, a grating of the optical encoder system, and the reader head assembly may be, for example, an encoder head thereof. Moreover, the optical encoder system may be configured to monitor the movement of a movable platform in a precision system such as a photolithography tool.

The displacement measuring apparatus, displacement measuring method and photolithography device of the present invention will be described in greater detail by way of particular embodiments with reference to the accompanying drawings. It would be appreciated that the embodiments disclosed hereinafter are merely exemplary embodiments that embody the present invention and do not limit the scope thereof in any sense.

It is to be noted that the drawings are provided in a very simplified form not necessarily drawn to exact scale and for the only purpose of helping to explain the disclosed exemplary embodiments in a more convenient and clearer way. Throughout the figures, like reference numbers and designations generally indicate like elements, unless otherwise stated. Moreover, the terms "first", "second" and so on, as used hereinafter, may be used to distinguish between similar elements without necessarily implying any particular ordinal or chronological sequence. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

FIG. 1 schematically illustrates the formation of a first output light beam in a displacement measuring apparatus according to an embodiment of the present invention. The displacement measuring apparatus and an optical path (or method) for producing the first output light beam 613 according to this embodiment will be detailed below with reference to FIG. 1.

A light source module (not shown in FIG. 1) emanates a first input light beam 610 and a second input light beam 611. In this embodiment, the first and second input light beams 610, 611 are spaced apart from each other by a given distance. The first and second input light beams 610, 611 are, for example, both laser beams each of a wavelength in the range of 150 nm to 2000 nm. Particularly, the wavelength may be selected from the range of 400 nm to 1500 nm, or 1500 nm to 2000 nm. More particularly, the wavelength of the first and second input light beams 610, 611 may be, for example, 633 nm, 980 nm or 1070 nm. The first and second input light beams 610, 611 may be at the same or slightly different frequencies (for example, there may be a frequency difference of 10 Hz or less between them). The spaced first input light beam 610 and second input light beam 611 enter the reader head assembly 100, which then guides the beams so that they come into contact with the light contacting surface of the diffractive member 200 in parallel and diffracted thereby. Here, in order to generate diffraction signals from the first and second input light beams 610, 611, these beams are configured to come into contact with (or be incident on) different locations of the light contacting surface of the diffractive member 200 at any identical non-Littrow angle.

The diffractive member 200 includes a plurality of duplicate diffractive elements (not shown in FIG. 1) that are arranged along a direction parallel to the light contacting surface. For the sake of clarity, FIG. 1 schematically illustrates a cross section of the displacement measuring apparatus in a Cartesian coordinate system. In this embodiment, the duplicate (identical) diffractive elements in the diffractive member 200 are arranged along the X-axis direction in FIG. 1. The diffractive member 200 may be either a one-dimensional or two-dimensional grating. In the latter case, the duplicate diffractive elements in the diffractive member 200 may be arranged further along the Y-axis direction that is perpendicular to the XZ-plane in FIG. 1. The grating may be implemented as a sinusoidal, rectangular or serrated grating, or a more complicated linear chirp grating. However, the present invention is not so limited because in other embodiments, the diffractive member 200 may alternatively be another diffraction structure such as a holographic diffraction structure. Regardless of whichever of the diffraction structures is used, it should include the above-described duplicate diffractive elements to enable diffraction of the first and second input light beams 610, 611 that are incident at the non-Littrow angle. In this embodiment, the diffractive member 200 is somewhat reflective to the first and second input light beams 610, 611.

The reader head assembly 100 includes at least two retroreflective elements, for example, the first retroreflective element 110 and second retroreflective element 111 as shown in FIG. 1. Each of these retroreflective elements can reflect an incident light beam so that the reflected light beam exiting the element propagates in parallel in the opposite direction to, and is offset by a distance from, the incident light beam. Therefore, optical path length(s) and propagation direction(s) of diffracted light beam(s) of the first input light beam 610 and/or the second input light beam 611 that has/have contacted the diffractive member 200 can be adjusted through changing the installation positions and angles of the retroreflective elements.

Figures 2A, 2B:
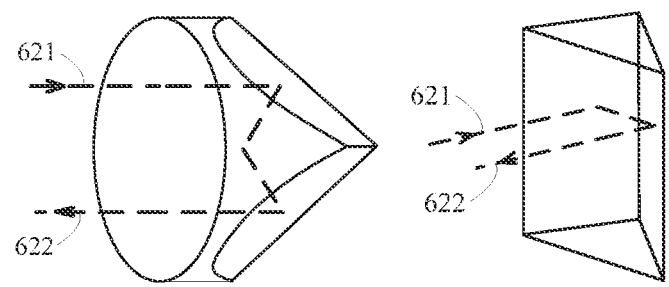
FIG. 2 (a) schematically illustrates a corner cube prism serving as a retroreflective element in the displacement measuring apparatus according to an embodiment of the present invention.
Figures 2C, 2D:
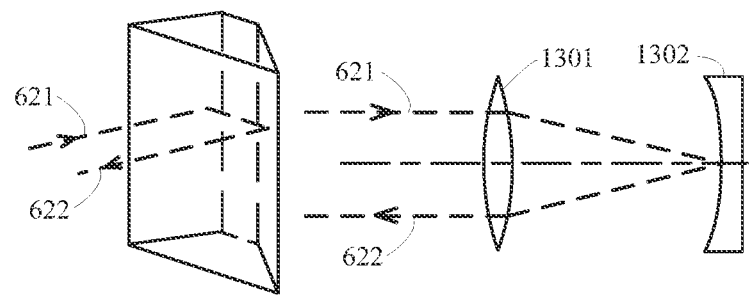

FIG. 2 (a) to 2 (d) show four variants of the retroreflective elements. Referring to FIG. 2 (a) to 2 (d), either or both of the first retroreflective element 100 and second retroreflective element 111 may be selected as a corner cube prism as shown in FIG. 2 (a), a Porro prism as shown in FIG. 2 (b), a Dove prism as shown in FIG. 2 (c) or a cat's eye reflector as shown in FIG. 2 (d). When a light beam 621 is incident on any of the retroreflective elements, it is output therefrom as a retroreflected light beam 622. Referring to FIG. 2 (d), the cat's eye reflector includes a lens 1301 and a concave mirror 1302 with its spherical center located at the principal point of the lens 1301 (the center of this thin lens). In addition, a focal point of the lens 1301 is located on a reflective surface of the concave mirror 1302. After passing through the lens 1301, the incident light beam 621 converges and is reflected on the concave mirror 1302, and the reflected beam 622 again passes through the lens 1301 and travels in parallel in the opposite direction to the incident light beam. In this embodiment, the first retroreflective element 110 and second retroreflective element 111 in the reader head assembly 100 are, for example, both corner cube prisms. In this case, for each of the corner cube prisms, the location where a light beam is incident on the light contacting surface and thus becomes an incident light beam for the corner cube prism and the location where the light beam exiting the corner cube prism is again incident on the light contacting surface may be any different locations on the light contacting surface. The positions of the corner cube prisms may be designed and modified as required.

When guided by the reader head assembly 100 to come into contact with the diffractive member 200 in parallel, the first input light beam 610 is diffracted (for the first time) at a first light spot location A, and the second input light beam 611 is diffracted (for the first time) at a second light spot location B. Preferably, both the first and second light spot locations A and B are located at the centers of respective diffractive elements. Alternatively, there are identical diffraction patterns at the first and second light spot locations A and B. This can result in an additional increase in measurement accuracy. In this embodiment, orders of the first diffraction of the first and second input light beams 610, 611 are of the same sign. Here, by "of the same sign", it is meant that orders of the first diffraction of the first and second input light beams 610, 611 are all positive or negative. Optionally, referring to FIG. 1, a $+n^{th}$ order (n is an integer other than 0, e.g., ±1, ±2, ±3, . . . , and +n denotes a positive integer, e.g., +1, +2, +3 . . . ; the same applies to the following) first diffracted light beam of the second input light beam 611 may propagate from the second light spot location B and be reflected to the outside by a first reflecting element 130. Additionally, a $+m^{th}$ order (m is an integer other than 0, e.g., ±1, ±2, ±3, . . . , and +m denotes a positive integer, e.g., +1, +2, +3 . . . ; the same applies to the following) first diffracted light beam of the first input light beam 610 may exit the first light spot location A. Further, the corner cube prism 110 is specially positioned so that the first diffracted light beam of the first input light beam 610 is retroreflected by the second retroreflective element 111 onto the diffractive member 200, reflected by the light contacting surface of the diffractive member 200 onto the first retroreflective element 110, retroreflected by the first retroreflective element 110 back onto the diffractive member 200 and reflected at the second light spot location B on the light contacting surface of the diffractive member 200. As a result, the reflected first diffracted light beam of the first input light beam 610 and the first diffracted light beam of the second input light beam 611 at least partially coincide with each other at the second light spot location B and exit together as the first output light beam 613, which is then captured and detected by a first optical detection module 411. The first optical detection module 411 may detect phase information of an interference signal formed by the first output light beam 613 and feed the detected information to the signal analysis module 500 via a first signal transmission optical fiber 431. The signal analysis module 500 may derive phase change information from the phase information of the interference signal of the first output light beam 613, and determine displacement information of the diffractive member 200 in a vertical degree of freedom in the direction of a normal to the light contacting surface based on a relationship between the two pieces of information.

Figure 4:
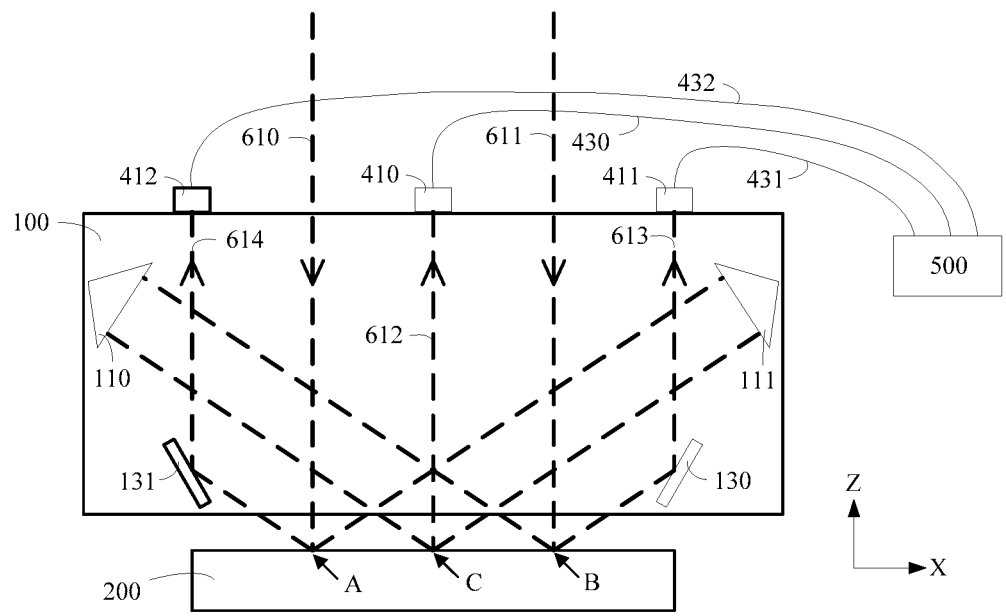
FIG. 4 schematically illustrates the formation of first, second and third output light beams in the displacement measuring apparatus according to an embodiment of the present invention.

In an alternative embodiment, referring to FIG. 4, the reader head assembly 100 so guides the first and second input light beams 610, 611 onto the diffractive member 200 in parallel that a $-m^{th}$ order first diffraction of the first input light beam 610 occurs at the first light spot location A, and a $-n^{th}$ order first diffraction of the second input light beam occurs at the second light spot location B. In this case, the first diffracted light beam of the second input light beam 611 is retroreflected by the first retroreflective element 110 to the diffractive member 200, reflected by the light contacting surface of the diffractive member 200 to the second retroreflective element 111, and retroreflected by the second retroreflective element 111 back to the diffractive member 200 and reflected at the first light spot location A on the light contacting surface of the diffractive member 200. As a result, the reflected first diffracted light beam of the second input light beam 611 and the first diffracted light beam of the first input light beam 610 at least partially coincide with each other at the first light spot location A and are together reflected by a second reflecting element 131 to the outside as a second output light beam 614, which is then captured and detected by a second optical detection module 412. The second optical detection module 412 may detect phase information of an interference signal formed by the second output light beam 614 and feed the detected information to the signal analysis module 500 via a second signal transmission optical fiber 432. The signal analysis module 500 may derive phase change information from the phase information of the interference signal of the first output light beam 613, and similarly determine displacement information of the diffractive member 200 in the vertical degree of freedom in the direction of a normal to the light contacting surface based on the relationship between the two pieces of information. Here, the term "vertical" refers to the direction of a normal to the light contacting surface of the diffractive member 200, e.g., the Z-axis direction shown in FIGS. 1 and 4.

In this embodiment, each of the first output light beam 613 and second output light beam 614 contains first diffracted light signals of the first and second input light beams 610, 611 of orders that are of the same sign and magnitude. Interference phases of the first 613 and second 614 output light beams are inverted to each other. That is, the interference signals of the first 613 and second 614 output light beams are inverted in phase. Preferably, the first output light beam 613 contains $+1^{st}$ order first diffracted light signals of the first and second input light beams 610, 611, and the second output light beam 614 contains $-1^{st}$ order first diffracted light signals of the first and second input light beams 610, 611.

Preferably, the first and second input light beams 610, 611 are parallel to each other as they are produced by the light source module, allowing direct detection of the phase information of the interference signals of the first and second output light beams 613, 614 with the above optical path design. However, the present invention is not so limited. When the first and second input light beams 610, 611 are not parallel before they are incident on the diffractive member 200, a beam angle controller may be arranged in the reader head assembly 100 to modify their propagation directions. Referring to FIG. 1, in order for the first and second input light beams 610, 611 to be incident on the diffractive member 200 exactly in accurate parallel, a first beam angle controller 700 may be arranged in an incident optical path of either of the first and second input light beams 610, 611 in order to deflect the light beam into parallel with the other of the first and second input light beams 610, 611. Similarly, in order to enable the first diffracted light signals of the first and second input light beams 610, 611 to at least partially coincide with each other (including both complete and partial coincidence) at the same light spot location (here, the "same light spot location" refers to an area where a light spot is located, for example, a circular area centered at the center of the light spot and having a diameter 0.5-1.5 times a diameter of the light spot (i.e., two light spot locations may be nested or tangent to each other)) of the light contacting surface and then travel in the same direction, a second beam angle controller 701 may be arranged in an optical path of either of the diffracted light beams. Each of the first and second beam angle controllers 700, 701 may be one selected from optics including a single wedge, a wedge pair, a diffraction grating and a birefringent element. It is to be noted, in this embodiment, the first and second reflecting elements 130, 131 are optional and may be selectively used according to the size of the reader head assembly 100 and the positions of the optical detection modules.

Since the first and second input light beams 610, 611 are incident on the diffractive member 200 in parallel, and because the reflected form of the first diffracted light beam of the first input light beam 610 after it has been retroreflected twice by the retroreflective elements and reflected twice by the diffractive member 200 travels in parallel to the original form, regardless of whether there is an angular change of the diffractive member 200 relative to the reader head assembly 100, the reflected first diffracted light beam of the first input light beam 610 is always parallel to the first diffracted light beam of the second input light beam 611. Therefore, with the displacement measuring apparatus according to this embodiment, obtaining the first and second output light beams 613, 614 in this way facilitates eliminating angular divergence of the coherent light beams caused by any rotation of the diffractive member 200 (particularly, relative to the X and Y axes in the coordinate system of FIG. 1) and can thus significantly reduce the influence of such rotation on the intensity of the interference signals produced by the output light beams, resulting in improved measurement accuracy and enhanced angular tolerance of the displacement measuring apparatus. Thus, according to this embodiment, vertical measurement with adaptivity to a wide angle is made possible.

The first output light beam 613 may contain the first diffracted light signals of the first and second input light beams 610, 611 of orders that are of the same sign and magnitude. Here, the term "first diffracted light signals" refers to signals carrying optical phase information of the first diffracted light beams resulting from the contact of the first input light beam 610 and/or the second input light beam 611 with the diffractive member 200 in parallel. It would be appreciated that while optical path lengths and propagation directions of the first diffracted light beams may vary when they are reflected by the retroreflective elements and diffractive member, the optical phase information of them remains the same.

Phase variation of the interference signal of the first output light beam 613 as a function of displacement of the diffractive member 200 is detailed below. As a result of the first and second input light beams 610, 611 coming in parallel into contact with the diffractive member 200, a $+m^{th}$ order first diffraction of the first input light beam 610 occurs at the first light spot location A, and a $+n^{th}$ order first diffraction of the second input light beam 611 occurs at the second light spot location B, resulting in the first output light beam 613 containing the $+m^{th}$ order first diffracted light signal of the first input light beam 610 and the $+n^{th}$ order first diffracted light signal of the second input light beam 611. When m=n, an interference signal indicative of a phase change caused by a vertical displacement is formed in the direction of the first output light beam 613. In order to determine how the phase change φz1 indicated in the interference signal of the first output light beam 613 varies with the vertical displacement of the diffractive member 200, it is assumed that the diffracted light signal of the first input light beam 610 in the first output light beam 613 has a phase of $\varphi z1_{b1}$, and the diffracted light signal of the second input light beam 611 has a phase of $\varphi z1_{b2}$. The phase change φz1 indicated in the interference signal resulting from interference between the two diffracted light beams occurring in response to the vertical displacement of the diffractive member 200 can be expressed as:

$$\varphi z1_{b1} = -\frac{2\pi m}{P}*\Delta X + \frac{2\pi m}{\lambda}*\Delta Z1*(1+5*\cos\theta) \quad (1)$$

$$\varphi z1_{b2} = -\frac{2\pi m}{P}*\Delta X + \frac{2\pi m}{\lambda}*\Delta Z1*(1+\cos\theta)$$

$$\varphi z1 = \varphi z1_{b1} - \varphi z1_{b2} = \frac{8\pi m}{\lambda}*\Delta Z1*\cos\theta.$$

$$\text{Thus, } \varphi z1 = \frac{8\pi m}{\lambda}*\Delta Z1*\cos\theta.$$

As discussed above, the second output light beam 614 contains the $-m^{th}$ order first diffracted light signal of the first input light beam 610 and the $-n^{th}$ order first diffracted light signal of the second input light beam 611 (m=n). Similarly, a phase change φz2 of the interference signal of the second output light beam 614 occurring as a result of a vertical displacement of the diffractive member 200 is given by:

$$\varphi z2 = -\frac{8\pi m}{\lambda}*\Delta Z2*\cos\theta. \quad (2)$$

In Eqns. (1) and (2), λ represents the wavelength of the first and second input light beams 610, 611 (if they have different frequencies, this is replaced with an average of their wavelengths); θ, an $m^{th}$ order diffraction angle (m=±1, ±2, ±3 . . . ) at which the first diffraction of the first and second input light beams 610, 611 occurs when they are incident in parallel on the diffractive member 200; ΔX, an assumed displacement of the diffractive member 200 in the X-axis direction; ΔZ1, a displacement of the diffractive member 200 in the Z-axis direction derived from the first output light beam 613; and ΔZ2, a displacement of the diffractive member 200 in the Z-axis direction derived from the second output light beam 614.

Apart from the first and second output light beams 613, 614 for displacement measurement in the vertical degree of freedom, the displacement measuring apparatus of the present invention can also form output light beams for detecting displacement information of the diffractive member 200 in a horizontal degree of freedom parallel to the direction of the light contacting surface.

Figure 3:
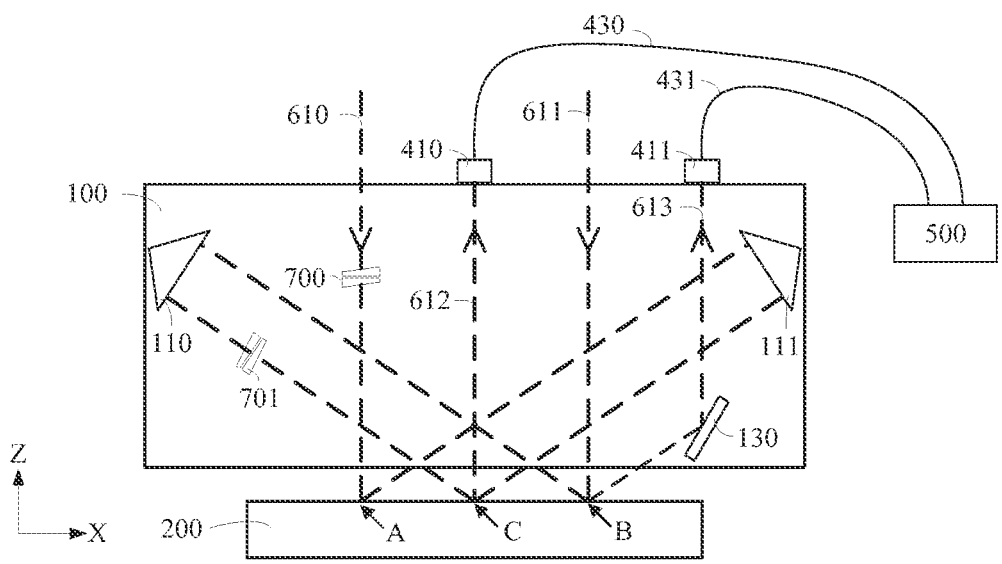
FIG. 3 schematically illustrates the formation of first and third output light beams in the displacement measuring apparatus according to an embodiment of the present invention.

FIG. 3 schematically illustrates the formation of first and third output light beams in the displacement measuring apparatus according to an embodiment of the present invention. Referring to FIG. 3, in the displacement measuring apparatus according to this embodiment, the reader head assembly 100 may be configured to output separate first output light beam 613 and third output light beam 612. Reference can be made to the above description for design details in connection with the first output light beam 613, and the third output light beam 612 will be described with emphasis below.

In this embodiment, as a result of the first and second input light beams 610, 611 coming into contact with the diffractive member 200 in parallel, first diffracted light beams of diffraction orders of opposite signs are produced. For example, upon their incidence on the diffractive member 200 at any non-Littrow angle at different locations, a $+m^{th}$ order first diffracted light beam is generated from the first input light beam 610 at a first light spot location A, and a $-n^{th}$ order first diffracted light beam is generated from the second input light beam 611 at a second light spot location B. The two first diffracted light beams are then retroreflected by the respective retroreflective elements and again come into contact with the diffractive member 200, where they are diffracted for the second time at orders of the respective same signs as the first diffraction, resulting in the formation at a third light spot location C of a $+m^{th}$ order second diffracted light beam of the first input light beam 610 and a $-n^{th}$ order second diffracted light beam of the second input light beam 611. In other words, the reader head assembly 100 may be so structurally designed that the second diffracted light beams of the first and second input light beams 610 and 611 at least partially coincide with each other at a single light spot location of the diffractive member and exit together as the third output light beam 612.

The third output light beam 612 from the reader head assembly 100 may be captured and detected by a third optical detection module 410. The third optical detection module 410 may detect phase information of an interference signal formed by the third output light beam 612 and feed the detected information to the signal analysis module 500 via a third signal transmission optical fiber 430. The signal analysis module 500 may analyze the received phase information, and determine displacement information of the diffractive member 200 in the horizontal degree of freedom along the direction of the light contacting surface from phase change information obtained from the interference signal of the third output light beam 612. Referring to FIG. 3, when the diffractive member 200 is a one-dimensional diffraction structure extending in the X-axis direction, displacement information of the diffractive member 200 in the X-axis direction can be obtained from the third output light beam 612. When the diffractive member 200 is a two-dimensional diffraction structure extending in both the X-axis and Y-axis directions (i.e., perpendicular to the XZ-plane), detection of displacement information of the diffractive member 200 in the Y-axis direction can be made possible simply by rotating the reader head assembly 100 and optical detection module in FIG. 3 by 90 degrees about the Z axis.

In the above embodiment of the displacement measuring apparatus with the optical path design for producing the third output light beam 612, after the first diffracted light beam generated from the incidence of the first input light beam 610 on the diffractive member 200 is retroreflected by the second retroreflective element 111, and the first diffracted light beam generated from the incidence of the second input light beam 611 on the diffractive member 200 is retroreflected by the first retroreflective element 110, the second diffracted light beam of the first input light beam 610 is in parallel with the first input light beam 610 which has not been diffracted, and the second diffracted light beam of the second input light beam 611 is in parallel with the second input light beam 611 which has not been diffracted. As a result, the second diffracted light beams of the first and second input light beams are in parallel with each other. It will be thus recognized that, regardless of whether there is an angular change of the diffractive member 200 relative to the reader head assembly 100 (in particular, to the X and Y axes), the second diffracted light beams of the first and second input light beams 610, 611 always remain parallel to each other. This facilitates eliminating angular divergence of the coherent light beams caused by any rotation of the diffractive member 200 (e.g., a grating) and can thus significantly reduce the influence of such rotation on the intensity of the interference signal, resulting in improved measurement accuracy and enhanced angular tolerance of the device. Thus, with the displacement measuring apparatus according to this embodiment, horizontal measurement with adaptivity to a wide angle is also made possible.

Phase variation of the interference signal of third output light beam 612 containing the second diffracted light beams of opposite signs and of the same magnitude of the first and second input light beams 610, 611 as a function of displacement of the diffractive member is detailed below. As a result of the second diffraction, a $+m^{th}$ order second diffracted light beam of the first input light beam 610 and a $-n^{th}$ order second diffracted light beam of the second input light beam 611 are produced in the reader head assembly 100. When m=n, an interference signal indicative of a phase change caused by a horizontal displacement is formed in the direction of the third output light beam 612. In order to determine how the phase change $\varphi x1$ indicated in the interference signal of the third output light beam 612 varies with the horizontal displacement, it is assumed that the diffracted light signal of the first input light beam 610 in the third output light beam 612 has a phase of $\varphi x1_{b1}$, and the diffracted light signal of the second input light beam 611 has a phase $\varphi z1_{b2}$. The phase change $\varphi x1$ indicated in the interference signal resulting from interference between the two diffracted light beams occurring in response to the horizontal displacement of the diffractive member 200 can be expressed as:

$$\varphi x1_{b1} = -\frac{2\pi m}{P} * \Delta X * 2 + \frac{4\pi m}{\lambda} * \Delta Z1 * (1 + \cos\theta) \quad (3)$$

$$\varphi x1_{b2} = +\frac{2\pi m}{P} * \Delta X * 2 + \frac{4\pi m}{\lambda} * \Delta Z1 * (1 + \cos\theta)$$

$$\varphi x1 = \varphi x1_{b1} - \varphi x1_{b2} = -\frac{8\pi m}{\lambda} * \Delta X$$

Thus, $\varphi x1 = -\frac{2\pi m}{P} * \Delta X * 2 - \frac{2\pi m}{P} * \Delta X * 2 = -\frac{8\pi m}{P} * \Delta X$ In Eqn. (3), P denotes a pitch of the duplicate diffractive elements in the diffractive member 200 that are arranged in the X-axis direction; m, the diffraction order, which is an integer other than 0, e.g., ±1, ±2, ±3 or the like; and ΔX, the amount of displacement of the diffractive member 200 in the X-axis direction to be measured.

Alternatively, horizontal displacement detection may also be based on second diffracted light beam of the respective opposite diffraction orders. For example, in another embodiment, a $-m^{th}$ order second diffracted light beam may result from the first input light beam 610 and a $+n^{th}$ order second diffracted light beam from the second input light beam 611, resulting in a third output light beam inverted in phase to φx1 in Eqn. (3).

In this embodiment, the diffractive member 200 may further include a plurality of duplicate diffractive elements arranged along the Y-axis direction that is perpendicular to the XZ-plane in FIG. 3 and to the X-axis direction. Based on similar considerations regarding the purpose of the third output light beam 612, a design similar to the above optical path design for forming the third output light beam 612 can be achieved in the reader head assembly 100 through properly guiding both the first and second input light beams 610, 611. In this design, a fourth output light beam (not shown) is formed as result of a first diffraction, retroreflection by the retroreflective elements and a second diffraction for the Y-axis direction. The fourth output light beam contains second diffracted light beams traveling from a single light spot location on the light contacting surface of the diffractive member 200 in the same direction. Phase change information contained in an interference signal produced by the fourth output light beam reflects displacement information of the diffractive member 200 in the Y-axis direction. In certain embodiments, the reader head assembly 100 may be rotated by 90 degrees about the Z axis in FIG. 3 to enable the formation of an output light beam indicative of displacement in the Y-axis direction, from which displacement information of the diffractive member 200 in the Y-axis direction can be derived.

As will be recognized from the above description, the displacement measuring apparatus according to this embodiment is capable of displacement measurement of the diffractive member 200 both in the horizontal degree of freedom parallel to the light contacting surface and in the vertical degree of freedom in the direction of a normal to the light contacting surface. In case of the diffractive member 200 being implemented as a two-dimensional diffraction structure, displacement measurement in at least three degrees of freedom is possible. Further, properly combining two or more of the above-discussed optical path designs for the input light beams, the reader head assembly and the optical detection modules can enable displacement measurement of the diffractive member 200 in more than three degrees of freedom, for example, the six degrees of freedom respectively in the X-axis direction, Y-axis direction, Z-axis direction, an $R_X$ direction (rotating about the X axis), an $R_y$ direction (rotating about the Y axis) and an $R_Z$ direction (rotating about the Z axis).

The displacement measuring apparatus according to this embodiment has the following advantages. First, it allows independent horizontal and vertical displacement measurements without needing the use of a decoupling algorithm. That is, for applications requiring only X- or Z-axis directional displacement measurements, it is only needed to detect one corresponding interference signal. Second, horizontal and vertical measurements are achievable with adaptivity to a wide range of angles, resulting in enhanced angular tolerance, improved measurement accuracy and reduced assembly and orientation control complexity of the displacement measuring apparatus. Third, the measurement signals used are based on self-parallel light beams not requiring precise adjustment, allowing simple integration. Fourth, the measuring system is simple in structure, with a large spare space, and highly scalable. Fifth, fewer types of components are included in the displacement measuring apparatus, resulting in lower cost. Sixth, since no light beams share a common optical path before they combine to form an interference signal, the adverse impact of splitting and polarization properties of the involved components is avoided. As can be appreciated based on knowledge in the field of metrology, the present invention is substantially free of nonlinearity errors. Seventh, in this embodiment, all the diffracted light beams resulting from the diffraction of the input light beams on the light contacting surface of the diffractive member are collected by the optical detection modules and used for the purpose of horizontal and vertical displacement measurement without light straying from the displacement measuring apparatus. Eighth, the prevention of stray light results in a very high optical power utilization of the displacement measuring apparatus.

FIG. 4 schematically illustrates the formation of the first, second and third output light beams in the displacement measuring apparatus according to an embodiment of the present invention. Referring to FIG. 4, in this embodiment, all the above-described first, second and third light beams 613, 614, 612 are formed in the reader head assembly 100. As can be appreciated from the foregoing description, by detecting and analyzing the three output light beams, horizontal displacement measurement (e.g., in the X-axis direction in FIG. 4) and dual-axis vertical displacement measurement (e.g., the Z-axis direction in FIG. 4) are achievable. Reference can be made to the above description for details in the optical path designs for the first, second and third light beams 613, 614, 612.

Two vertical displacement measurement results can be obtained by capturing and analyzing the two output light beams both for the vertical degree of freedom and from different light spot locations of the diffractive member 200. Advantageously, this allows compensation for the adverse impact of environmental factors on the measurement optical paths (e.g., when the two output light beams are produced for Z-axis directional displacement measurement in different environments), thus resulting in improved displacement measurement accuracy and precision. Another advantage is that the two vertical displacement measurement results can be further utilized to derive displacement information of the diffractive member 200 in a rotational degree of freedom about an axis within the light contacting surface, as detailed below.

In the exemplary scenario of FIG. 4 in which the first and second output light beams 613, 614 are both traveling in the XZ-plane, the first and second optical detection modules 411, 412 obtain phase information of them and feed the obtained information to the signal analysis module 500, which then derives an amount of displacement ΔZ1 of the diffractive member 200 in the Z-axis direction from the phase information of the first output light beam 613, as well as an amount of displacement ΔZ2 of the diffractive member 200 in the Z-axis direction from the phase information of the second output light beam 614. ΔZ1 and ΔZ2 satisfy $$Ry = \frac{\Delta Z2 - \Delta Z1}{D_{f1f2}}. \tag{4}$$

In Eqn. (4), ΔZ1 and ΔZ2 are the amounts of vertical displacement derived from the first and second output light beams 613, 614, and $D_{f1f2}$ is the distance between locations where the first and second output light beams come into contact with the diffractive member in parallel (e.g., the distance between the first light spot location A and the second light spot location B in FIG. 4).

According to Eqn. (4), an amount of rotation of the diffractive member 200 about the X axis in FIG. 4, i.e., amount of displacement thereof in the $R_X$ degree of freedom, can be derived from the first and second output light beam both propagating in the YZ plane and both containing vertical displacement information.

Figure 5:
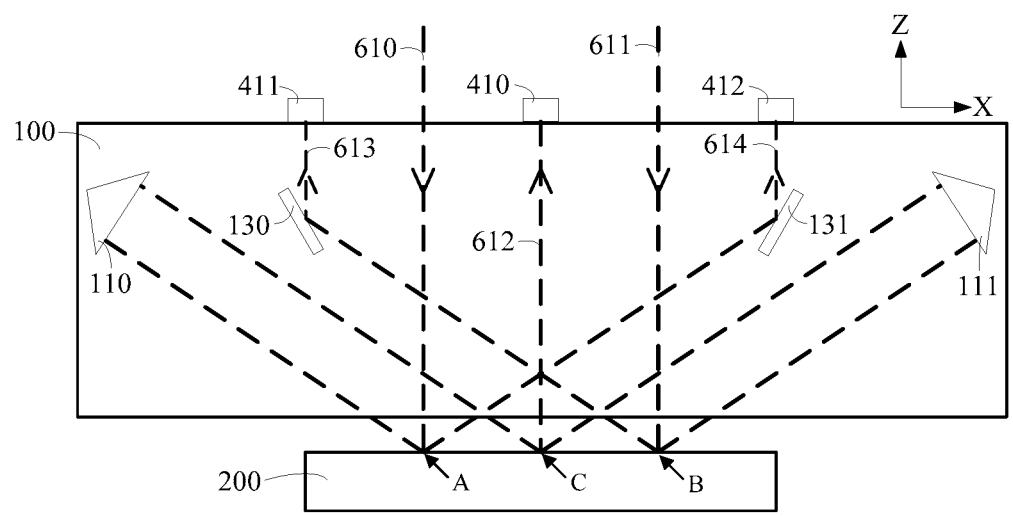
FIG. 5 schematically illustrates the formation of first, second and third output light beams in the displacement measuring apparatus according to another embodiment of the present invention.

FIG. 5 schematically illustrates the formation of the first, second and third output light beams in the displacement measuring apparatus according to another embodiment of the present invention. Referring to FIGS. 4 and 5, after receiving the first and second input light beams 610, 611, the reader head assembly 100 guides them so that they are incident in parallel on the light contacting surface of the diffractive member 200 and diffracted thereby. The diffracted light beams are reflected by the first 110 and second 111 retroreflective elements, and the incident light beam are reflected by the light contacting surface of the diffractive member 200. Diffracted light beams of diffraction orders of opposite signs to those of FIG. 4 are collected, resulting in the formation of the first, second and third light beams 613, 614, 612 with opposite diffraction orders to those of FIG. 4. The signal transmission optical fibers and signal analysis module in this embodiment are structured and functions in the same way as those of FIG. 4, so they are omitted in FIG. 5.

For example, for the third output light beam 612, in this embodiment, a $-m^{th}$ order first diffracted light beam resulting from a first diffraction of the first input light beam 610 on the light contacting surface of the diffractive member 200 is reflected by a retroreflective element back to the diffractive member 200 and diffracted thereby for the second time (second diffraction), resulting in the formation of a $-m^{th}$ order diffracted beam. At the same time, a $+n^{th}$ order first diffracted light beam resulting from a first diffraction of the second input light beam 611 on the light contacting surface of the diffractive member 200 is reflected by a retroreflective element back to the diffractive member 200 and diffracted thereby for the second time (second diffraction), resulting in the formation of a $+n^{th}$ order diffracted beam. The second diffracted light beams of the first and second input light beams 610, 611 at least partially coincide with each other at the same light spot location and exit together in the same direction. When m=n, the third output light beam 612 indicating a phase change φx2 occurring as a result of a X-axis directional displacement is formed and satisfies:

$$\varphi x2 = \frac{2\pi m}{P} * \Delta X * 2 + \frac{2\pi m}{P} * \Delta X * 2 = \frac{8\pi m}{P} * \Delta X \quad (5)$$

In this equation, P represents a pitch of the diffractive elements in the diffractive member 200 such as, for example, a grating, in the X-axis direction, m is the diffraction order, which may be an integer other than 0, e.g., ±1, ±2, ±3 or the like, and ΔX is an amount of X-axis directional displacement of the diffractive member 200 that is to be measured. Referring to FIG. 5, in this embodiment, phase data derived from the two output light beams related to Z-axis directional displacement is inverted to that of FIG. 4. In practical optical path design, either a positive or negative diffraction order may be chosen based on considerations including the shape of and available space for the reader head assembly 100. In any of these cases, displacement information of the diffractive member 200 in one or more degrees of freedom can be derived from phase change information contained in interference signals produced by the output light beams for the degrees of freedom. Since the diffracted beams that combine to form the output light beams upstream of the signal detectors do not share common optical paths, quality of the resulting interference signals is not affected by insufficient splitting properties, polarization mixing and other factors of the involved components, high output signal quality of the displacement measuring apparatus can be achieved.

In the above embodiments, the light source module may be implemented as a single-frequency laser. In this case, the first and second input light beams 610, 611 emanated from the light source module are of the same frequency. In addition, when implemented as a single-frequency laser, the light source module is compact in size and can be directly disposed around the reader head assembly 100. Alternatively, the produced light beams may also be transmitted to the reader head assembly 100 via optical fibers. Still alternatively, the light source module may be integrated together with the optical detection modules inside the reader head assembly 100, resulting in an integral unit with the capabilities of light sourcing, guidance and detection. This integral unit provides high flexibility of use, greatly reduces integration and maintenance complexity in field applications, results in improved efficiency and is suitable for use in various applications requiring high and low-precision displacement measurement.

Figure 6:
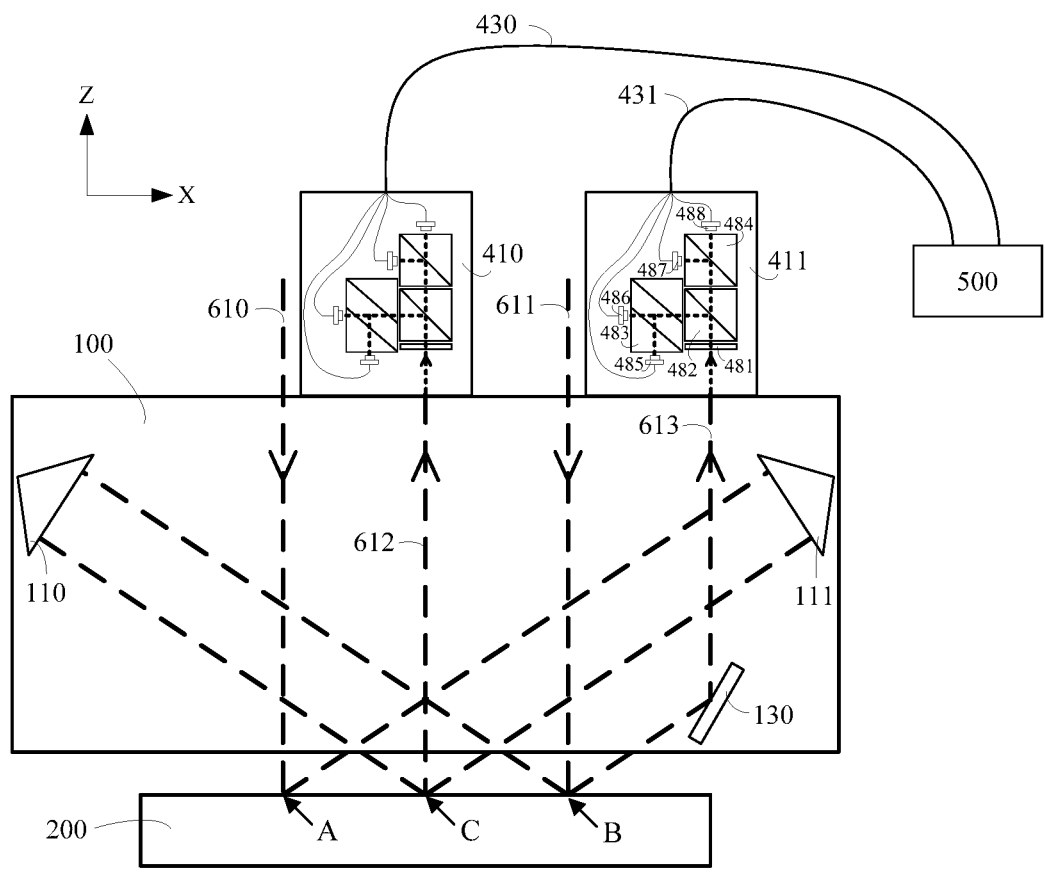
FIG. 6 schematically illustrates a configuration of the displacement measuring apparatus with input light beams of the same frequency according to an embodiment of the present invention.

When the two input light beams received by the reader head assembly 100 are of the same frequency, phase detection may be accomplished by a four phase shift method. FIG. 6 schematically illustrates a configuration of the displacement measuring apparatus with input light beams of the same frequency according to an embodiment of the present invention. Referring to FIG. 6, each of the first optical detection module 411 for receiving the first output light beam 613 and the third optical detection module 410 for receiving the third output light beam 612 includes a set of a quarter-wave plate and non-polarizing and polarizing splitters and is able to shift the phase of the interference signal to output four versions thereof offset by 90 degrees for subsequent use in displacement calculation. For example, in order to obtain the four phase-shifted signals, the first optical detection module 411 may include a quarter-wave plate 481, a non-polarizing splitter 482, a first polarizing splitter 483, a second polarizing splitter 484, a first optical coupler 485, a second optical coupler 486, a third optical coupler 487 and a fourth optical coupler 488.

In the above four phase shift method, an output light beam carrying displacement information of the diffractive member contains two diffracted light signals respectively of the first and second input light beams 610, 611, which satisfy the requirement that their polarization directions are perpendicular (orthogonal) to each other before they are provided to an optical detection module. Accordingly, it may be configured that the first and second input light beams 610, 611 have mutually orthogonal polarization directions as early as before they reach the reader head assembly 100. Alternatively, a polarization control element may be arranged in an optical path in the reader head assembly 100 for either one of the first and second input light beams 610, 611 in order to modify the polarization direction of the specific input light beam into orthogonality with that of the other input light after they have been received by the reader head assembly 100. In this way, when provided to the optical detection module, the output light beam contains two diffracted light beams (or diffracted light signals) respectively of the first and second input light beams 610, 611 and with polarization directions that are orthogonal to each other. The polarization control element may be implemented as, for example, a wave plate or a polarizer.

In the above embodiments, the light source module may also be implemented as a dual-frequency laser based on optical fiber transmission. In this case, the first and second input light beams 610, 611 may of different frequencies (usually with a small frequency difference).

Figure 7:
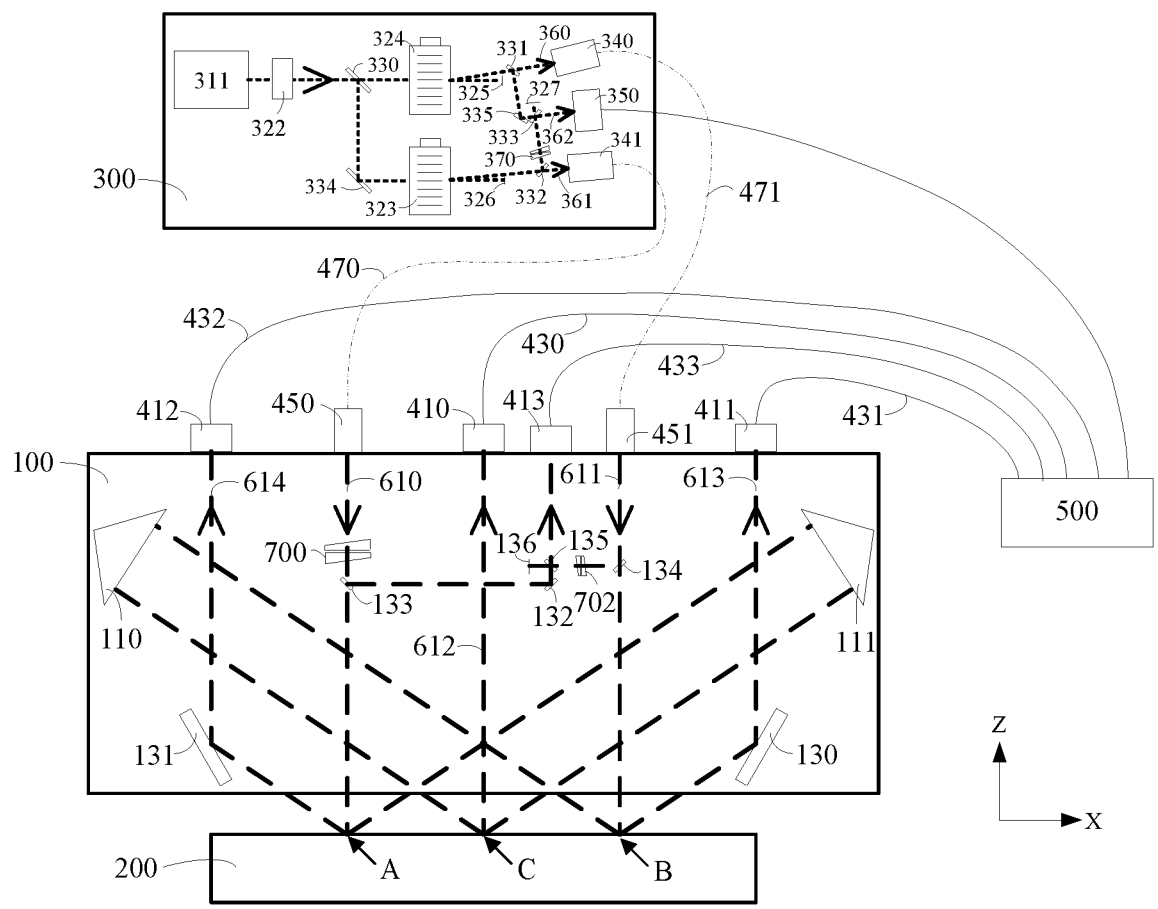
FIG. 7 schematically illustrates a configuration of the displacement measuring apparatus with input light beams of different frequencies according to an embodiment of the present invention.

FIG. 7 schematically illustrates a configuration of the displacement measuring apparatus with input light beams of different frequencies according to an embodiment of the present invention. Referring to FIG. 7, in this embodiment, the light source module 300 is a dual-frequency laser based on optical fiber transmission, which may include the following optics: a single-frequency laser 311; an isolator 322; a first acousto-optic frequency shifter 323; a second acousto-optic frequency shifter 324; a first beam splitter 330; a second beam splitter 331; a third beam splitter 332; a fourth beam splitter 333; a first reflector 334; a second reflector 335; a first shutter 325; a second shutter 326; a third shutter 327; a third beam angle controller 370; a first polarization-maintaining optical fiber coupler 340; a second polarization-maintaining optical fiber coupler 341; and a multimode optical fiber coupler 350. How this dual-frequency laser operates to output two light beams of different frequencies is detailed below.

A laser beam produced by the single-frequency laser 311 is split into two beams, which are frequency-shifted by the two acousto-optic frequency shifters driven by different frequencies. The resulting two laser beams respectively having a first frequency and a second frequency are coupled with most of their energy by the polarization-maintaining optical fiber couplers to the reader head assembly 100. The remaining energy of the laser beams is combined by the reflectors and the beam splitters to form a reference laser signal. The beam angle controller may be configured to adjust the light beams of the first and second frequencies in order to facilitate the synthesis of the reference laser signal. In another embodiment, the combination of the beams may also be accomplished using a second polarizing splitter or a diffraction grating.

The light beam of the first frequency produced in the dual-frequency laser (i.e., the light source module 300) is transmitted through the first polarization-maintaining optical fiber 470 to a collimator 450 associated with the first polarization-maintaining optical fiber and then introduced to the reader head assembly 100 as the aforementioned first input light beam 610. The light beam of the second frequency produced in the light source module 300 is transmitted through the second polarization-maintaining optical fiber 471 to a collimator 451 associated with the second polarization-maintaining optical fiber and then introduced to the reader head assembly 100 as the aforementioned second input light beam 611. As discussed above, the first and second input light beams 610, 611 are guided by the reader head assembly 100 so as to be diffracted on the light contacting surface of the diffractive member 200 once or twice, resulting in the formation of the above-described first, second and third output light beams 613, 614, 612. These output light beams are detected respectively by the first, second and third optical detection modules 411, 412, 410. Thereafter, the first optical detection module 411 transmits the interference signal of the first output light beam 613 to the signal analysis module 500 through the first signal transmission optical fiber 431, the second optical detection module 412 transmits the interference signal of the second output light beam 614 to the signal analysis module 500 through the second signal transmission optical fiber 432, and the third optical detection module 410 transmits the interference signal of the third output light beam 612 to the signal analysis module 500 through the third signal transmission optical fiber 430. In addition, the dual-frequency laser also outputs a reference light beam from the multimode optical fiber coupler 350, which is not received by the reader head assembly 100 but directly transmitted to the signal analysis module 500 through a signal transmission optical fiber.

Since the laser beams of different frequencies are susceptible to phase changes due to variations in environmental factors such as temperature, pressure and vibration during their transmission in the optical fibers, compensation is necessary. Referring to FIG. 7, such compensation may be accomplished internally within the reader head assembly 100. After the beams of different frequencies from the optical fibers are collimated back to free space light beams, and before they are incident on the light contacting surface of the diffractive member 200 to experience phase changes, small portions may be split respectively from the first and second input light beams 610, 611 of different frequencies and combined to form a remote reference light signal (optics involved in this process may include, for example, a third reflecting element 132, a first beam splitting element 133, a second beam splitting element 134, a third beam splitting element 135, a fourth beam angle controller 702 and a fourth shutter 136, as shown in FIG. 7), which may be detected by a fourth optical detection module 413 and sent to the signal analysis module 500 through a fourth signal transmission optical fiber 433. In this case, the signal analysis module 500 may subtract an amount of displacement derived from the remote reference light signal from each of the amounts of displacement in the various degrees of freedom derived from the first, second and third output light beams 613, 614, 612 to obtain correct displacement information in the degrees of freedom that is free of the adverse impact of transmission in the optical fibers. In other embodiments, the remote reference light signal may also be formed using beam splitters or polarizing splitters, and the combination of the two light beams may also be accomplished with a diffraction grating. In such embodiments, one or more beam angle controllers may be arranged in the reader head assembly 100 as required. Referring to FIG. 7, the first beam angle controller 700 may be configured to facilitate adjusting the first and second input light beams 610, 611 of different frequencies incident on the reader head assembly 100 into parallel, and the third beam angle controller 702 may be configured to facilitate adjusting parallelism of the remote reference light signal.

Using the dual-frequency laser based on optical fiber transmission as the light source module of the displacement measuring apparatus provides the following advantages:

First, during displacement measurement of the diffractive member, the diffracted beams resulting from the input light beams of different frequencies do not share common optical paths before the signal detectors, immunizing the interference signals from the influence of insufficient splitting properties, polarization mixing and other factors of the involved components, making the measuring system substantially free of nonlinearity errors and thus dispensing with the need for accounting for such errors during optical signal processing.

Second, if the polarization directions of the two incident light beams of different frequencies from the light source module are identical, the resulting signals indicative of horizontal and vertical displacements can be directly detected without the need of providing one or more polarizers for synthesis of interference signals at the phase detection stage, which may lead to additional energy loss. In such scenarios, optical signal intensity and an optical power utilization of up to 100% can be achieved. Moreover, optical properties of the light beams will be less affected, and the involved optics can be fabricated more easily. In case the polarization directions of the two input light beams are not completely orthogonal to each other, it is also possible to directly detect the resulting signals indicative of horizontal and vertical displacements without the need of providing one or more polarizers at the phase detection stage. However, in such scenarios, the signal intensity is weaker, and there is a certain degree of light power loss. When the polarization directions are orthogonal to each other, direct detection of the signals indicative of horizontal and vertical displacements is impossible, and it is necessary to arrange one or more polarizers upstream of the optical detection modules. As a result of using the polarizers, an optical power loss rate of about 50% is expected.

Third, the reader head assembly is allowed to be deployed at any position as desired, resulting in high flexibility of use, significantly reduced integration and maintenance complexity in field applications and improved efficiency. For example, the reader head assembly may be mounted on a moving stage so as to be moveable therewith, while the diffractive member may be arranged in a subsystem without needing to move.

Figure 8:
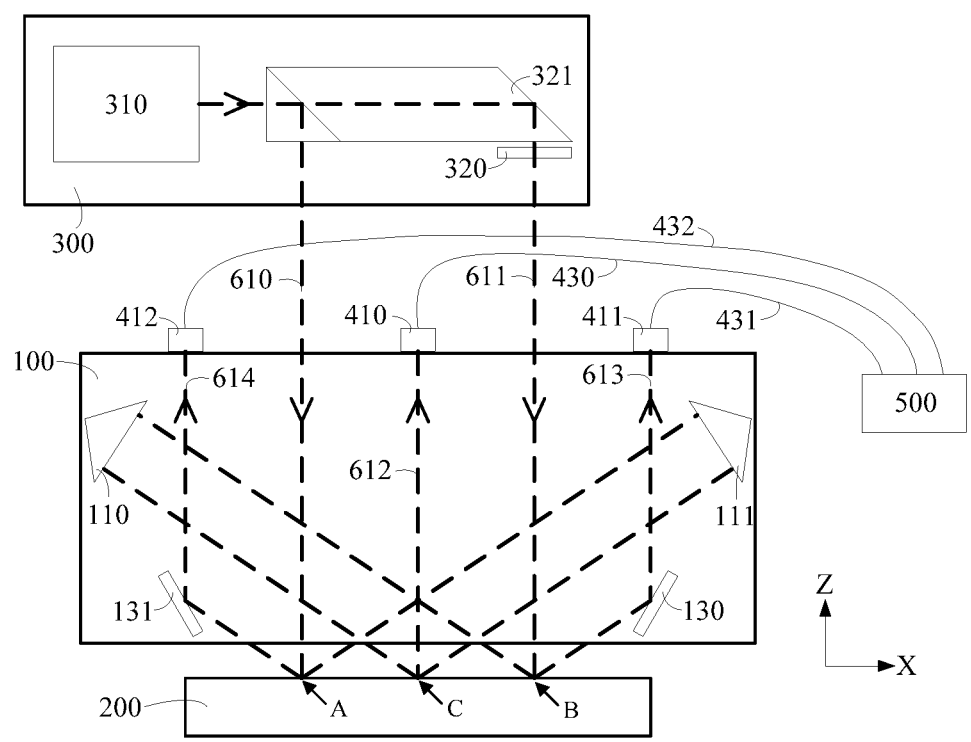
FIG. 8 schematically illustrates a configuration of the displacement measuring apparatus with input light beams of different frequencies according to another embodiment of the present invention.

In order to be able to provide input light beams of different frequencies, the light source module in the displacement measuring apparatus may alternatively include a free space dual-frequency laser. FIG. 8 schematically illustrates a configuration of the displacement measuring apparatus with input light beams of different frequencies according to another embodiment of the present invention. Referring to FIG. 8, in this embodiment, the light source module 300 includes a free space dual-frequency laser, and specifically, the light source module 300 may include a free space dual-frequency laser 310, a second polarizing splitter 321 and polarization state modifier 320. How this free space dual-frequency laser 310 in the light source module 300 operates to output two light beams of different frequencies is detailed below.

Generally, the free space dual-frequency laser produces two laser beams with a slight frequency difference therebetween: a laser beam of a first frequency and a laser beam of a second frequency. In addition, polarization directions of these two laser beams are orthogonal to each other. Here, it is assumed that the laser beam of the first frequency is S-polarized, and that of the second frequency is P-polarized. When incident on the second polarizing splitter 321, the S-polarized light beam of the first frequency is reflected at a polarization splitting surface of the polarizing splitter, and the reflected beam serves as the aforementioned first input light beam 610; the P-polarized light beam of the second frequency transmits through the polarization splitting surface, reflected by the second polarizing splitter 321 so as to be offset from the first input light beam 610, and then transmits through the polarization state modifier 320 to become an S-polarized beam which serves as the aforementioned second input light beam 611. In this way, the light source module 300 can provide two input light beams that travel in parallel and are polarized in the same direction.

As described above, when received by the reader head assembly 100, the first and second input light beams 610, 611 are guided and combined thereby to form the first, second and third light beams 613, 614, 612, which are detected by the optical detection modules to allow the signal analysis module to derive therefrom displacement information of the diffractive member 200 in different degrees of freedom. The splitting action of the second polarizing splitter 321 may be accompanied by the occurrence of a few nonlinearity errors. In order to eliminate them, the signal analysis module 500 may be designed or chosen to have the necessary photoelectric detection and signal processing capabilities for the elimination. The polarization state modifier 320 may be made of one half-wave plate, two quarter-wave plates, or any other polarization control and modification element well known in the art, which can change the polarization state of a light beam.

The light source module would be bulky in size when including the above-described free space dual-frequency laser. Therefore, in this case, the displacement measuring apparatus is preferably used for displacement measurement of the diffractive member 200 in multiple degrees of freedom in applications with the diffractive member 200 being movable with a moving stage and the reader head assembly being immobilized. Moreover, compared with the above embodiments employing the dual-frequency laser based on optical fiber transmission, the light source module employing the free space dual-frequency laser dispenses with the need for the reader head assembly 100 to produce a remote reference light signal and has the advantages of a simpler optical path design, a reduced number of measurement axes and enhanced optical power utilization and reduced structural complexity of the device.

The present invention also provides a photolithography device including a wafer stage and a reticle stage, which can move relative to each other. The photolithography device also includes the above-described displacement measuring apparatus.

Photolithography is a critical process for the fabrication of semiconductor devices, and one of its tasks is to guide the irradiation of a spatial pattern onto a photoresist-coated substrate (e.g., glass or silicon substrate). This involves determining the locations of the substrate to receive irradiation (called "alignment") and determining the location of the photoresist to which light irradiation is to be applied (called "exposure"). In order to guide the photoresist-coated substrate into alignment with the spatial pattern to allow light to be irradiated onto desired locations of the substrate, a wafer stage on which the substrate is supported is usually designed as a (translationally and rotationally) movable platform, while a reticle stage supporting thereon a reticle is usually designed to be stay stationary during movement of the wafer stage. Depending on the design of the used photolithography device, the reticle stage may be configured to move with the reticle thereon in coordination with the wafer stage during an exposure process. Photolithography devices are important equipment for the fabrication of semiconductor devices and products containing such devices, for example, semiconductor chips, liquid crystal panels, OLED panels and CCD sensors.

The above-described displacement measuring apparatus may be used as an encoder system of the photolithography device, which is configured to accurately measure the position of a substrate during an exposure process being performed by the photolithography device. Specifically, the diffractive member 200 as shown in FIGS. 1 to 8 (e.g., a grating) may be attached to one of the wafer and reticle stages, with the reader head assembly 100 being attached to the other. Since the wafer and reticle stages are moveable relative to each other during operation of the photolithography device, the grating and the reader head assembly may be attached in a manner taking into account the weight and size constraints.

The adaptivity of the displacement measuring apparatus to a wide angle results in enhanced angular tolerance of the displacement measuring apparatus and the encoder system, reduced impact of any rotation of the diffractive member on the intensity of interference signals, reduced setup and orientation control complexity, reduced or even eliminated nonlinearity errors that may occur in designs with one or more co-shared optical paths, improved measurement accuracy and precision of the photolithography device.

The present invention also provides a displacement measuring method, which can be implemented by the above-described displacement measuring apparatus. Specifically, the displacement measuring method includes the steps of:

(1) providing a diffractive member including a light contacting surface and a plurality of duplicate diffractive elements arranged in a direction parallel to the light contacting surface;

(2) producing first and second input light beams;

(3) guiding the first and second input light beams so that they come into contact with the diffractive member in parallel and are diffracted thereby, guiding and combining diffracted light beams resulting from the diffraction of the first and second input light beams with at least two retroreflective elements to form at least one output light beam each containing diffracted light signals corresponding respectively to the first and second input light beams, which exit the same light spot location of the light contacting surface of the diffractive member in the same direction;

(4) detecting the output light beam(s); and (5) deriving displacement information of the diffractive member from phase change information indicated in interference signal(s) of the respective output light beam.

In embodiments of the displacement measuring method as shown in FIGS. 1 to 8, upon the first and second input light beams 610, 611 coming into contact with the diffractive member 200 in parallel, the first input light beam 610 is diffracted for the first time at a first light spot location A, and the second input light beam 611 is simultaneously diffracted for the first time at a second light spot location B. Orders of the first diffraction of the first and second input light beams 610, 611 are of the same sign. A first diffracted light beam resulting from the first input light beam 610 (the second input light beam 611, according to another embodiment) is so guided that it is successively reflected by retroreflective elements and the diffractive member 200. For example, it may be successively reflected by one retroreflective element, the light contacting surface of the diffractive member 200, another retroreflective element and again the light contacting surface of the diffractive member 200. During the last reflection, it at least partially coincides with a first diffracted light beam resulting from the second input light beam 611 (the first input light beam 610, according to the aforesaid embodiment) at the same light spot location and exits in the same direction thereas, thus resulting in the formation of a first output light beam 613 (a second output light beam 614, according to the aforesaid embodiment). The first and second output light beams 613, 614 form respective interference signals that are inverted in phase, and phase change information of these interference signals reflects displacement information of the diffractive member 200 in a vertical degree of freedom in the direction of a normal to the light contacting surface. An amount of vertical displacement of the diffractive member 200 corresponding to a phase change of the interference signal of the first output light beam 613 is given by Eqn. (1) above, and an amount of vertical displacement of the diffractive member 200 corresponding to a phase change of the interference signal of the second output light beam 614 is given by Eqn. (2) above.

Preferably, in the above method, both the first and second output light beams 613, 614 are formed to achieve dual-axis vertical displacement measurement. In this case, after the first and second output light beams 613, 614 are detected, displacement information of the diffractive member 200 in the vertical degree of freedom can be derived from the interference signals of the first and second output light beams 613, 614. According to Eqn. (4) above, the impact of environmental factors on the measurement optical paths can be mitigated, resulting in improved measurement accuracy. Additionally, according to Eqn. (4), displacement information of the diffractive member 200 in a rotational degree of freedom about an axis within the light contacting surface can be obtained.

With this displacement measuring method, in addition to displacement information of the diffractive member 200 in the vertical degree of freedom, displacement information thereof in a horizontal degree of freedom (here, defined as along the XY-plane in FIG. 1) can also be obtained, as described in detail below.

The first diffracted light beams resulting from the first diffraction of the first and second input light beams 610, 611 that occurs as a result of their contact with the diffractive member 200 in parallel are reflected by respective retroreflective elements back onto the diffractive member 200 so that a second diffraction occurs, resulting in second diffracted light beams of the first and second input light beams 610, 611, which at least partially coincide with each other at a third light spot location C on the light contacting surface of the diffractive member 200 and exit in the same direction. As a result, a third output light beam 612 is produced, which forms an interference signal containing phase change information that reflects displacement information of the diffractive member 200 in the horizontal degree of freedom in a direction parallel to the light contacting surface. A phase change indicated in the interference signal of the third output light beam 612 is given by Eqn. (3) above. In the illustrated embodiments, the second diffracted light beams of the first and second input light beams 610, 611 that form the third output light beam 612 are of diffraction orders of opposite signs, and for each of the input light beams, diffraction orders of the first and second diffracted light beams are of the same sign. In addition, the diffraction orders of the diffracted light signals of the first and second input light beams 610, 611 that form the third output light beam 612 are of the same magnitude. For example, the third output light beam 612 may contain a $+1^{st}$ order second diffracted light beam (or second diffracted light signal) of the first input light beam 610 and a $-1^{st}$ order second diffracted light beam (or second diffracted light signal) of the second input light beam 611. In an alternative embodiment, the third output light beam 612 may contain a $-1^{st}$ order second diffracted light beam of the first input light beam 610 and a $+1^{st}$ order second diffracted light beam of the second input light beam 611.

Appropriately combining two or two of the above-discussed processes for producing the output light beams can enable displacement measurement of the diffractive member 200 in three or more than three degrees of freedom, for example, the six degrees of freedom respectively in the X-axis direction, Y-axis direction, Z-axis direction, an $R_X$ direction (rotating about the X axis), an $R_y$ direction (rotating about the Y axis) and an $R_z$ direction (rotating about the Z axis).

The output light beam reflecting displacement information of the diffractive member 200 in different degrees of freedom, e.g., the first output light beam 613, the second output light beam 614 and the third output light beam 612, may be detected optically (or experience phase detection), and the detected optical signals may be transmitted through signal transmission optical fibers and analyzed to derive the displacement information of the diffractive member 200 in the degrees of freedom from phase change information of interference signals of the output light beams.

In the displacement measuring method according to this embodiment, upon the first and second input light beams 610, 611 coming into contact with the diffractive member 200 in parallel, they are diffracted (for the first time), and their diffracted light signals are then so reflected back to the light contacting surface of the diffractive member 200 that they exit from the same light spot on the surface in the same direction, thus forming at least one output light beam each independently associated with displacement information of the diffractive member in only one degree of freedom. In this way, when multiple such output light beams are produced, displacement information of the diffractive member in different degrees of freedom can be obtained without needing a decoupling algorithm. This facilitates eliminating angular divergence of the coherent light beams caused by any rotation of the diffractive member (e.g., relative to one or more axes in the light contacting surface) and can thus reduce the influence of such rotation on the interference information, resulting in improved measurement accuracy and endowing adaptivity to a wide angle. Moreover, any displacement measuring apparatus that implements the method can also have increased angular tolerance and reduced assembly and orientation control complexity. Further, since the output light beams are independent of one another, the interference signal of each of them can be separately analyzed to derive displacement information of the diffractive member in a respective degree of freedom (or direction), simplifying the calculation. Furthermore, compared with approaches that employ a decoupling algorithm to derive amounts of displacement in respective degrees of freedom from a single output light beam, the displacement measuring method according to this embodiment can significantly reduce or even eliminate nonlinearity errors that may occur due to the co-sharing of one or more optical paths.

As the displacement measuring method according to this embodiment and the above-discussed displacement measuring apparatus are overall based on a common concept, reference may be made to the above description in connection with the displacement measuring apparatus for any detail in the method.

While the invention has been described above with reference to several preferred embodiments, it is not intended to be limited to these embodiments in any way. In light of the teachings hereinabove, any person of skill in the art may make various possible variations and changes to the disclosed embodiments without departing from the scope of the invention. Accordingly, any and all such simple variations, equivalent alternatives and modifications made to the foregoing embodiments without departing from the scope of the invention are intended to fall within the scope thereof.

What is claimed is:

1. A displacement measuring apparatus, comprising:
    a light source module, configured to produce a first input light beam and a second input light beam;
    a diffractive member, comprising a light contacting surface and a plurality of duplicate diffractive elements arranged in a direction parallel to the light contacting surface;
    a reader head assembly, comprising at least two retroreflective elements, the reader head assembly configured to receive and guide the first and second input light beams to come into contact with the light contacting surface of the diffractive member in parallel and to be diffracted thereon, at least one of the diffracted first and second input light beams is then guided by the at least two retroreflective elements so as to be combined with rest of the diffracted first and second input light beams to form at least one output light beam each containing diffracted light signals respectively of the first and second input light beams, which exit in a same direction from a same light spot location of the light contacting surface of the diffractive member;
    an optical detection module, configured to detect each of the at least one output light beam; and
    a signal analysis module, connected to the optical detection module, the signal analysis module configured to derive displacement information of the diffractive member from phase change information contained in an interference signal produced by each of the at least one output light beam;
    wherein as a result of being guided by the reader head assembly to come into contact with the light contacting surface of the diffractive member in parallel, the first input light beam experiences a first diffraction at a first light spot location to result in a respective first diffracted light beam, and the second input light beam experiences a first diffraction at a second light spot location to result in a respective first diffracted light beam, the first diffracted light beam of the first input light beam is then reflected successively by the retroreflective elements and the diffractive member so as to at least partially coincides with the first diffracted light beam of the second input light beam at the second light spot location and exits together with the first diffracted light beam of the second input light beam in the same direction, resulting in the formation of a first output light beam that forms an interference signal containing phase change information reflecting first displacement information of the diffractive member in a vertical degree of freedom along a direction of a normal to the light contacting surface.

2. The displacement measuring apparatus of claim 1, wherein as a result of being guided by the reader head assembly to come into contact with the light contacting surface of the diffractive member in parallel, the first input light beam experiences a first diffraction at the first light spot location to result in a respective first diffracted light beam, and the second input light beam experiences a first diffraction at the second light spot location to result in a respective first diffracted light beam, the first diffracted light beam of the second input light beam is then reflected successively by the retroreflective elements and the diffractive member so as to at least partially coincides with the first diffracted light beam of the first input light beam at the first light spot location and exits together with the first diffracted light beam of the first input light beam in the same direction, resulting in the formation of a second output light beam that forms an interference signal containing phase change information reflecting second displacement information of the diffractive member in the vertical degree of freedom along the direction of the normal to the light contacting surface.

3. The displacement measuring apparatus of claim 2, wherein each of the first and second output light beams contains first diffracted light signals respective of the first and second input light beams, which are of diffraction orders of same sign and magnitude, and wherein the interference signals of the first and second output light beams are inverted in phase.

4. The displacement measuring apparatus of claim 3, wherein the first output light beam contains+1st order first diffracted light signals of the first and second input light beams, and the second output light beam contains−1st order first diffracted light signals of the first and second input light beams.

5. The displacement measuring apparatus of claim 2, wherein the signal analysis module is further configured to derive displacement information of the diffractive member in a rotational degree of freedom that rotates about an axis within the light contacting surface from the phase change information of the interference signals of the first and second output light beams.

6. The displacement measuring apparatus of claim 1, wherein first diffracted light beams of the first and second input light beams resulting from first diffractions thereof occurring as a result of contact with the light contacting surface of the diffractive member in parallel under the guidance of the reader head assembly are retroreflected by the retroreflective elements back onto the diffractive member and both diffracted thereon for a second time, resulting in second diffracted light beams, which at least partially coincide with each other at a third light spot location of the diffractive member and exit therefrom in a same direction and thereby form a third output light beam that form an interference signal containing phase change information reflecting third displacement information of the diffractive member in a horizontal degree of freedom along a direction parallel to the light contacting surface.

7. The displacement measuring apparatus of claim 1, wherein the diffractive member is a one-dimensional grating or a two-dimensional grating.

8. The displacement measuring apparatus of claim 1, wherein each of the retroreflective elements is one selected from a group comprising a corner cube prism, a Porro prism, a cat's eye reflector and a Dove prism.

9. The displacement measuring apparatus of claim 1, wherein the reader head assembly comprises a beam angle controller.

10. The displacement measuring apparatus of claim 9, wherein the beam angle controller is one selected from a group comprising a single wedge, a wedge pair, a diffraction grating and a birefringent element.

11. The displacement measuring apparatus of claim 1, wherein the first and second input light beams are laser beams of different frequencies.

12. The displacement measuring apparatus of claim 11, wherein the light source module comprises a dual-frequency laser based on optical fiber transmission, and wherein the reader head assembly is further configured to, prior to the contact of the first and second input light beams with the diffractive member in parallel, receive the first and second input light beams, split portions from the respective input light beams, and combine the split portions to form a remote reference light beam.

13. The displacement measuring apparatus of claim 11, wherein the light source module comprises a free space dual-frequency laser and a beam splitting element, the free space dual-frequency laser configured to produce a dual-frequency light beam, the beam splitting element configured to split the dual-frequency light beam into two light beams with orthogonal polarization directions.

14. The displacement measuring apparatus of claim 11, wherein the light source module or the reader head assembly comprises a polarization control element configured to cause the diffracted light signals respectively of the first and second input light beams in each of the at least one output light beam to enter the optical detection module with a same polarization direction.

15. The displacement measuring apparatus of claim 1, wherein the first and second input light beams are laser beams of same frequency.

16. The displacement measuring apparatus of claim 15, wherein the light source module or the reader head assembly comprises a polarization control element configured to cause the diffracted light signals respectively of the first and second input light beams in each of the at least one output light beam to enter the optical detection module with orthogonal polarization direction.

17. The displacement measuring apparatus of claim 16, wherein the reader head assembly produces at least four output light beams, and wherein the optical detection module is configured to detect the at least four output light beams and, for each of the output light beams, shift phase of an interference signal thereof to successively output four signals each offset from a previous one of the four signals by 90 degrees.

18. A displacement measuring method, comprising:
providing a diffractive member comprising a light contacting surface and a plurality of duplicate diffractive elements arranged in a direction parallel to the light contacting surface;
producing a first input light beam and a second input light beam;
guiding the first and second input light beams to come into contact with the light contacting surface of the diffractive member in parallel and to be diffracted thereon, using the at least two retroreflective elements to guide at least one of the diffracted first and second input light beams to be combined with rest of the diffracted first and second input light beams to form at least one output light beam each containing diffracted light signals respectively of the first and second input light beams, which exit in a same direction from a same light spot location of the light contacting surface of the diffractive member;
detecting each of the at least one output light beam; and
deriving displacement information of the diffractive member from phase change information contained in an interference signal produced by each of the at least one output light beam;
wherein as a result of being guided to come into contact with the light contacting surface of the diffractive member in parallel, the first input light beam experiences a first diffraction at a first light spot location to result in a respective first diffracted light beam, and the second input light beam experiences a first diffraction at a second light spot location to result in a respective first diffracted light beam, the first diffracted light beam of the first input light beam is then reflected successively by the retroreflective elements and the diffractive member so as to at least partially coincides with the first diffracted light beam of the second input light beam at the second light spot location and exits together with the first diffracted light beam of the second input light beam in the same direction, resulting in the formation of a first output light beam that forms an interference signal containing phase change information reflecting first displacement information of the diffractive member in a vertical degree of freedom along a direction of a normal to the light contacting surface.

19. The displacement measuring method of claim 18, wherein a phase change indicated in the interference signal of the first output light beam and an amount of displacement of the diffractive member in the vertical degree of freedom satisfy $$\varphi z 1 = \frac{8\pi m}{\lambda} * \Delta Z 1 * \cos\theta,$$

where φz1 represents the phase change indicated in the interference signal of the first output light beam; ΔZ1, the amount of displacement of the diffractive member in the vertical degree of freedom; λ an average wavelength of the first and second input light beams; and θ, a $m^{th}$ order diffraction angle of the first diffractions that occur as a result of the first and second input light beams coming into contact with the light contacting surface of the diffractive member in parallel, where m is an integer other than 0.

20. The displacement measuring method of claim 18, wherein as a result of being guided to come into contact with the light contacting surface of the diffractive member in parallel, the first input light beam experiences a first diffraction at the first light spot location to result in a respective first diffracted light beam, and the second input light beam experiences a first diffraction at the second light spot location to result in a respective first diffracted light beam, the first diffracted light beam of the second input light beam is then reflected successively by the retroreflective elements and the diffractive member so as to at least partially coincides with the first diffracted light beam of the first input light beam at the first light spot location and exits together with the first diffracted light beam of the first input light beam in the same direction, resulting in the formation of a second output light beam that forms an interference signal containing phase change information reflecting second displacement information of the diffractive member in the vertical degree of freedom; wherein the interference signals of the first and second output light beams are inverted in phase.

21. The displacement measuring method of claim 20, further comprising:

detecting the first and second output light beams and deriving displacement information of the diffractive member in a rotational degree of freedom that rotates about an axis within the light contacting surface from the displacement information in the vertical degree of freedom of the diffractive member reflected in the phase change information of the interference signals of the first and second output light beams.

22. The displacement measuring method of claim 21, wherein amounts of displacement of the diffractive member indicated respectively in the first and second output light beams satisfy $$Ry = \frac{\Delta Z 2 - \Delta Z 1}{D_{f1f2}},$$

where ΔZ1 and ΔZ2 are the amounts of displacement of the diffractive member indicated respectively in the first displacement information of the diffractive member in the vertical degree of freedom reflected in the first output light beam and in the second displacement information of the diffractive member in the vertical degree of freedom reflected in the second output light beam, and $D_{f1f2}$ is a distance between the first and second light spot locations.

23. The displacement measuring method of claim 18, wherein first diffracted light beams of the first and second input light beams resulting from first diffractions thereof occurring as a result of contact with the light contacting surface of the diffractive member in parallel are retroreflected by the retroreflective elements back onto the diffractive member and both diffracted thereon for a second time, resulting in second diffracted light beams, which at least partially coincide with each other at a third light spot location of the diffractive member and exit therefrom in a same direction and thereby form a third output light beam that form an interference signal containing phase change information reflecting third displacement information of the diffractive member in a horizontal degree of freedom along a direction parallel to the light contacting surface.

24. The displacement measuring method of claim 23, wherein a phase change indicated in the interference signal of the third output light beam and an amount of displacement of the diffractive member in the horizontal degree of freedom satisfy $$\varphi x 1 = -\frac{2\pi m}{P} * \Delta X * 2 - \frac{2\pi m}{P} * \Delta X * 2 = -\frac{8\pi m}{P} * \Delta X,$$

where φx1 represents the phase change indicated in the interference signal of the third output light beam, ΔX is the amount of displacement of the diffractive member in a first direction, P is a pitch of the duplicate diffractive elements in the diffractive member in the direction of the horizontal degree of freedom, and m is an integer other than 0.

25. A photolithography device, comprising a wafer stage and a reticle stage, which are moveable relative to each other, wherein the photolithography device further comprises the displacement measuring apparatus as defined in claim 1, and wherein the diffractive member is attached to one of the wafer stage and the reticle stage, and the reader head assembly is attached to rest of the wafer stage and the reticle stage.

* * * * *